US012721006B2

(12) United States Patent
Kim et al.

(10) Patent No.: US 12,721,006 B2
(45) Date of Patent: Aug. 25, 2026

(54) METHOD FOR MANUFACTURING DISPLAY DEVICE INCLUDING FIRST COVER LAYER AND SECOND COVER LAYER BY CURLING FIRST INK AND SECOND INK

(71) Applicant: Samsung Display Co., LTD., Yongin-si (KR)

(72) Inventors: Jungwook Kim, Seongnam-si (KR); Heechang Kim, Hwaseong-si (KR); Eunjoong Mun, Seongnam-si (KR); Kyounghee Park, Yongin-si (KR); Jiyun Bang, Cheonan-si (KR); Hyeon Deuk Hwang, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 373 days.

(21) Appl. No.: 18/198,590

(22) Filed: May 17, 2023

(65) Prior Publication Data

US 2024/0040904 A1 Feb. 1, 2024

(30) Foreign Application Priority Data

Jul. 26, 2022 (KR) ........................ 10-2022-0092188

(51) Int. Cl.
*H10K 59/80* (2023.01)
*H10K 59/65* (2023.01)
(Continued)

(52) U.S. Cl.
CPC ........... *H10K 59/873* (2023.02); *H10K 59/65* (2023.02); *H10K 71/135* (2023.02); *H10K 71/421* (2023.02)

(58) Field of Classification Search
CPC ...... H10K 59/873; H10K 59/38; H10K 71/00; H10K 59/1201; H10K 59/122;
(Continued)

(56) References Cited

U.S. PATENT DOCUMENTS

| | | | | |
|---|---|---|---|---|
| 9,162,441 | B1 * | 10/2015 | Noda | B41J 2/2132 |
| 10,573,813 | B2 * | 2/2020 | Jia | H10K 71/441 |

(Continued)

FOREIGN PATENT DOCUMENTS

| | | |
|---|---|---|
| CN | 108368367 A | 8/2018 |
| JP | 2008012743 A | 1/2008 |

(Continued)

OTHER PUBLICATIONS

B. Majhy et al., "Attraction and Repulsion between Liquid Droplets over a Liquid-Impregnated Surface", J. Phys. Chem. Lett. 11, 10001-10006 (2020).

(Continued)

*Primary Examiner* — Caleb E Henry
(74) *Attorney, Agent, or Firm* — CANTOR COLBURN LLP

(57) ABSTRACT

A display device includes: a display panel including a hole area, a first area adjacent to the hole area, and a second area other than the hole area and the first area; a first cover layer under the display panel, defining a first opening in the hole area, and overlapping the first area and the second area; and a second cover layer under the first cover layer, defining a second opening in the hole area, overlapping the first area and the second area, and including a groove defined along a boundary between the first area and the second area.

12 Claims, 39 Drawing Sheets

(51) Int. Cl.
*H10K 71/13* (2023.01)
*H10K 71/40* (2023.01)

(58) Field of Classification Search
CPC ........... H10K 50/854; H10K 2102/331; H10K 50/844; H10K 50/11; H10K 50/182; H10K 71/12; H10K 71/135; H10K 71/15; H10K 59/65; H10K 71/421; H10K 59/121; H10K 50/865; H10K 2102/351; C09D 11/38; C09D 11/50; C09D 11/52; C09K 11/06; C09K 2211/10; C09K 11/02; H01L 24/95; H01L 33/44; H01L 33/62; H01L 2224/95085; H01L 25/0753; H01L 33/0095; H01L 33/20; H01L 33/26; H01L 51/56; H01L 51/5287; H01L 51/5012; H01L 51/0003; H01L 27/3246; H01L 51/0005; H01L 51/0007; H01L 51/5253; G01M 7/08; B41J 2/07; B41J 3/543; B41J 11/0021
See application file for complete search history.

(56) References Cited

U.S. PATENT DOCUMENTS 11,214,699 B2 * 1/2022 Choi ...................... H10K 71/15
11,307,454 B2 * 4/2022 Hsu ................... G02F 1/133317
11,307,686 B2 * 4/2022 Li ......................... G06F 3/0412
11,333,915 B2 * 5/2022 Yu ....................... H04M 1/0264
11,597,848 B2 * 3/2023 Sim ........................ C09D 11/50
2001/0003602 A1 * 6/2001 Fujita ..................... H10K 50/11 427/64
2003/0012870 A1 * 1/2003 Sakurada ............... G02B 5/201 359/896
2007/0001608 A1 * 1/2007 Lee ....................... H01J 29/864 313/587
2009/0152509 A1 * 6/2009 Choi ...................... C09D 11/52 252/511
2011/0134181 A1 * 6/2011 Oh ......................... H05K 3/125 347/20
2012/0021547 A1 * 1/2012 Kawanishi ............. C09D 11/38 257/E51.024
2014/0292864 A1 * 10/2014 Motoyanagi ......... B41J 11/0095 347/14
2016/0126499 A1 * 5/2016 Dai ...................... H10K 59/875 257/40
2017/0107388 A1 4/2017 Wang
2018/0102449 A1 * 4/2018 Pschenitzka ...... G02F 1/133528
2019/0224954 A1 7/2019 Jang et al.
2020/0114658 A1 * 4/2020 Sakaguchi ................. B41J 2/41
2020/0308435 A1 * 10/2020 Kim ....................... C09D 11/36
2020/0326597 A1 * 10/2020 Rogojina ............... C09K 11/62
2021/0036253 A1 * 2/2021 Asaoka ................ H10K 71/135
2021/0179876 A1 * 6/2021 Li ........................ H10K 85/636
2021/0269662 A1 * 9/2021 Sim ...................... H10K 71/191
2021/0332256 A1 * 10/2021 Sim ...................... H10K 71/135
2022/0069158 A1 * 3/2022 Jung ...................... C09D 11/36
2022/0204796 A1 * 6/2022 Jung ...................... C09D 11/38

FOREIGN PATENT DOCUMENTS

JP 2022057155 A 4/2022
KR 1020100034261 A 4/2010
KR 1020100032013 A 8/2010
KR 1020170080959 A 7/2017
KR 20190090108 A 8/2019
KR 102176438 B1 11/2020
KR 1020210147451 A 4/2022

OTHER PUBLICATIONS

Xin Huang et al., “Deformation and coalescence of water droplets in viscous fluid under a direct current electric field”, Int.J. Multiphase Flow 18, 1-9 (2019).
Korean Office Action for Korean Application No. 10-2022-0092188; Report Mail Date Jan. 20, 2026 (17 Pages; with English Translation).

* cited by examiner

METHOD FOR MANUFACTURING DISPLAY DEVICE INCLUDING FIRST COVER LAYER AND SECOND COVER LAYER BY CURLING FIRST INK AND SECOND INK

This application claims priority to Korean Patent Application No. 10-2022-0092188, filed on Jul. 26, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to a display device, a method for manufacturing the display device, and an apparatus for manufacturing the display device performing the manufacturing method.

2. Description of the Related Art

A display device is a device that displays an image for providing visual information to a user. Among display devices, an organic light emitting diode display has recently attracted attention.

The display device may include a cover panel disposed under the display panel. The cover panel may protect the display panel disposed below the display panel. For example, the cover panel may include a light blocking layer that blocks light, an impact resistance layer that absorbs impact, and a heat dissipation layer that blocks heat.

SUMMARY

Embodiments provide a display device with improved impact resistance.

Embodiments provide a method for manufacturing the display device.

A display device according to an embodiment includes: a display panel including a hole area, a first area adjacent to the hole area, and a second area other than the hole area and the first area; a first cover layer under the display panel, defining a first opening in the hole area, and overlapping the first area and the second area; and a second cover layer under the first cover layer, defining a second opening in the hole area, overlapping the first area and the second area, and including a groove defined along a boundary between the first area and the second area.

In an embodiment, a first height of the second cover layer in the boundary between the first area and the second area may be less than a second maximum height of the second cover layer overlapping the first area and a third maximum height of the second cover layer overlapping the second area.

In an embodiment, the first area may be adjacent to the hole area in a predetermined direction, and a width of the first area in the predetermined direction may be about 4 millimeters (mm) or less.

In an embodiment, the second cover layer may include an acrylic resin.

In an embodiment, the display device may further include a functional module under the second cover layer and overlapping the hole area.

A method of manufacturing a display device according to an embodiment includes: positioning a display panel including a hole area, a first area adjacent to the hole area, and a second area other than the hole area and the first area on a stage; forming a first cover layer defining a first opening therein overlapping the hole area by applying and curing a first ink to the first area and the second area on the display panel; applying and curing a second ink to the first area on the first cover layer; and applying and curing the second ink to the second area on the first cover layer.

In an embodiment, the applying and curing of the second ink to the first area on the first cover layer and the applying and curing of the second ink to the second area on the first cover layer may be performed separately.

In an embodiment, the first area may be adjacent to the hole area in a first direction, and a width of the first area in the first direction may be about 4 mm or less.

In an embodiment, in the applying of the second ink to the first area, the second ink may be applied in the first direction.

In an embodiment, in the applying of the second ink to the second area, the second ink may be applied in the first direction.

In an embodiment, in the applying of the second ink to the second area, the second ink may be applied in a second direction opposite to the first direction.

In an embodiment, a second cover layer defining a second opening therein overlapping the hole area may be formed by applying and curing the second ink to the first area and applying and curing the second ink to the second area.

In an embodiment, a shape matching ratio of the second cover layer overlapping the first area may be about 60% or more.

In an embodiment, the shape matching ratio may be calculated according to Equation 1 below:

$$\left(1-\frac{EA+UA}{PA}\right)*100(\%), \qquad \text{[Equation 1]}$$

Here, PA is an area of a target shape of the second cover layer overlapping the first area in a cross-sectional view, EA is an area of a portion of the second cover layer overlapping the first area outside the target shape, and UA is an area of a portion of the target shape outside the second cover layer.

In an embodiment, the second ink may be applied and cured in the second area after the second ink is applied and cured in the first area.

In an embodiment, the second ink may be applied and cured in the first area after the second ink is applied and cured in the second area.

In an embodiment, the second ink may include an acrylic resin.

An apparatus for manufacturing a display device according to an embodiment includes: a stage on which a display panel including a hole area, a first area adjacent to the hole area, and a second area other than the hole area and the first area is disposed; a first inkjet device for applying and curing a first ink to the first area and the second area on the display panel; and a second inkjet device spaced apart from the first inkjet device, for applying and curing a second ink to the first area on the display panel, and applying and curing the second ink to the second area on the display panel.

In an embodiment, the second inkjet device may include an inkjet head and a light irradiation unit.

In an embodiment, the inkjet head may apply the second ink to the first area in a first direction and the light irradiation unit may cure the second ink on the first area, and the inkjet head may apply the second ink to the second area in the first direction and the light irradiation unit may cure the second ink on the second area.

In an embodiment, the second inkjet device may include: a first inkjet head, a first light irradiation unit adjacent to the first inkjet head, a second inkjet head spaced apart from the first inkjet head and a second light irradiation unit adjacent to the second inkjet head. The first inkjet head, the first light irradiation unit, the second inkjet head, and the second light irradiation unit may be disposed sequentially in a second direction opposite to a first direction.

In an embodiment, the first inkjet head may apply the second ink to the first area in the first direction and the first light irradiation unit may cure the second ink on the first area, and the second inkjet head may apply the second ink to the second area in the first direction and the second light irradiation unit may cure the second ink on the second area.

In an embodiment, the first inkjet head may apply the second ink to the second area in the first direction and the first light irradiation unit may cure the second ink on the second area, and the second inkjet head may apply the second ink to the first area in the first direction and the second light irradiation unit may cure the second ink on the first area.

In an embodiment, the second inkjet device may include a first light irradiation unit, an inkjet head and a second light irradiation unit, and the first light irradiation unit, the inkjet head, and the second light irradiation unit may be disposed sequentially in a second direction opposite to a first direction.

In an embodiment, the first inkjet head may apply the second ink to the first area in the first direction and the second light irradiation unit may cure the second ink on the first area, and the first inkjet head may apply the second ink to the second area in the second direction and the first light irradiation unit may cure the second ink on the second area.

In an embodiment, the first inkjet head may apply the second ink to the second area in the first direction and the second light irradiation unit may cure the second ink on the second area, and the first inkjet head may apply the second ink to the first area in the second direction and the first light irradiation unit may cure the second ink on the first area.

In a display device according to embodiments of the present disclosure, as the first cover layer and the second cover layer are formed, respectively, by applying the first ink and the second ink with an inkjet device, manufacturing costs of the display device may be reduced by reducing costs.

In addition, the step of applying the second ink to the first area and the step of applying the second ink to the second area are performed separately, so that the shape matching ratio of the second cover layer overlapping the first area may be about 60% or more. Thus, the impact resistance of the second cover layer in the first area may be secured, and the reliability of the display device may be effectively secured.

Since the second inkjet device includes two inkjet heads and two light irradiators, the second cover layer may be formed in one scan as the stage moves in the second direction. Accordingly, the manufacturing time of the second cover layer may be reduced, and the manufacturing process efficiency of the display device may be effectively improved.

Since the second inkjet device includes a first light irradiation unit, a first inkjet head, and a second light irradiation unit adjacent to each other, the stage moves in the first direction to form a portion of the second cover layer, and the stage moves in the direction opposite to the second direction to form the remaining portion of the second cover layer. Accordingly, the manufacturing time of the second cover layer may be reduced, and the manufacturing process efficiency of the display device may be improved by reducing the manufacturing cost of the display device.

DETAILED DESCRIPTION

Figure 1:
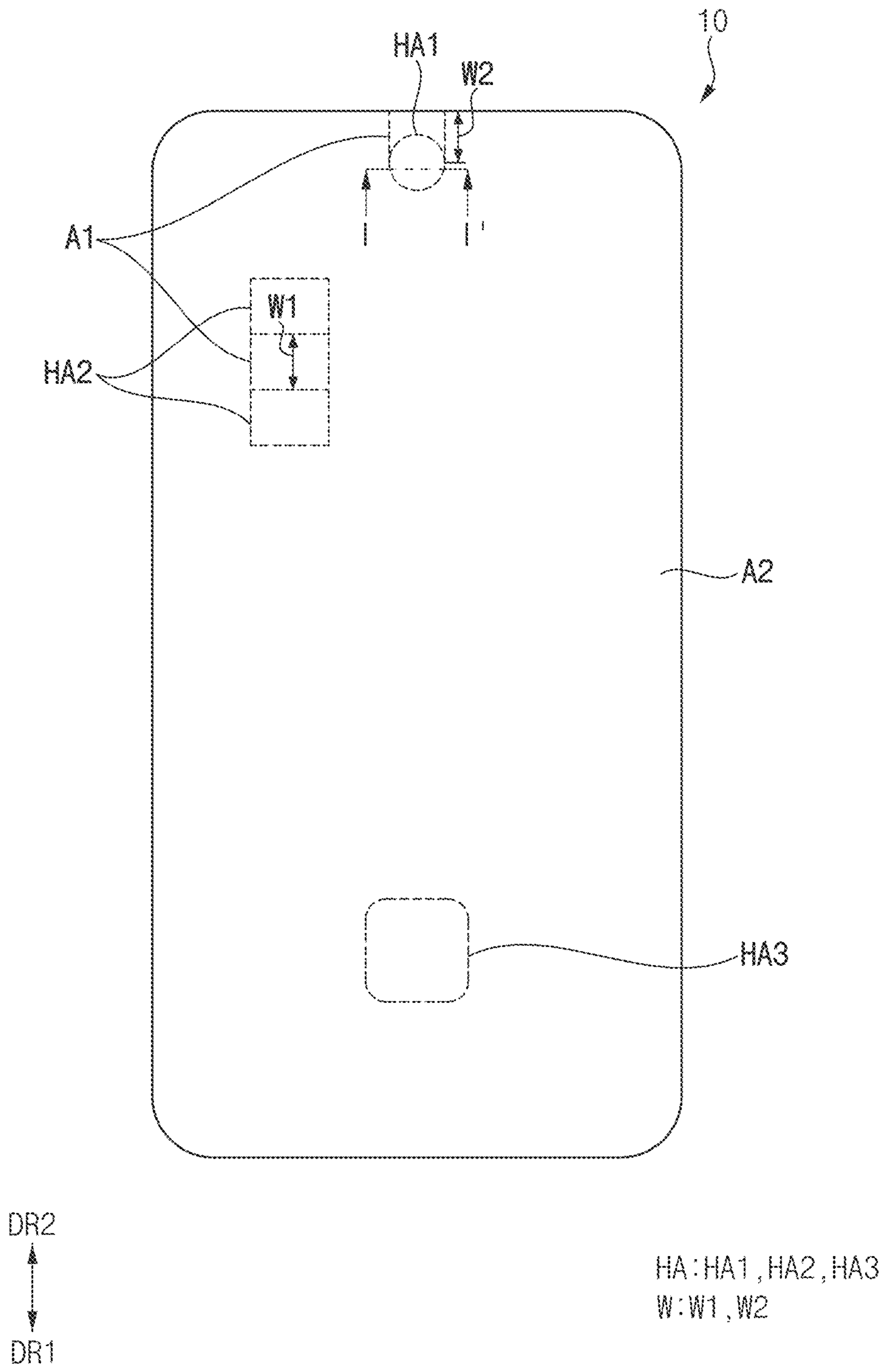
FIG. 1 is a plan view of a display device according to an embodiment of the present disclosure.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view of a display device according to an embodiment of the present disclosure. As used herein, the "plan view" is a view in a thickness direction (i.e., third direction DR3) of the display device 10.

The display device 10 may include a hole area HA, a first area A1, and a second area A2.

The hole area HA may be a non-display area that does not display a screen. The hole area HA may be an area through which external light is transmitted. For example, a hole (opening) may be defined in the hole area HA, and a functional module may be disposed in the hole area HA. The display device 10 may include at least one hole area HA, for example, the display device 10 may include a plurality of hole areas HA.

For example, the display device 10 may include three hole areas HA. The hole areas HA may include a first hole area HA1, a second hole area HA2, and a third hole area HA3. The first hole area HA', the second hole area HA2, and the third hole area HA3 may be sequentially positioned in the first direction DR1.

The first hole area HA' may be disposed at an edge area of the second area A2. The first hole area HA' may have a circular shape in a plan view. The second hole area HA2 may be disposed inside the second area A2. Two holes may be defined in the second hole area HA2. Each of the second hole areas HA2 may have a quadrangular shape in a plan view. The third hole area HA3 may be disposed inside the second area A2. The third hole area HA3 may have a rectangular shape with rounded corners in a plan view. However, the shape of each of the first to third hole areas HA1, HA2, and HA3 is not limited thereto.

The first area A1 may be adjacent to the hole area HA. The first area A1 may be adjacent to the hole area HA in a second direction DR2. A width W of the first area A1 in the second direction DR2 from the hole area HA may be about 4 millimeters (mm) or less. The display device 10 may include at least one first area A1, for example, the display device 10 may include a plurality of first areas A1.

In an embodiment, the first area A1 may refer to an area having a width W in the second direction DR2 of about 4 mm or less from the hole area HA among areas adjacent to the plurality of hole areas HA' and HA2. Accordingly, a width W2 of the first area A1 adjacent to the first hole area HA' in the second direction DR2 may be about 4 mm or less, and a width W1 of the first area A1 adjacent to the lower second hole area HA2 in the second direction DR2 may be about 4 mm or less.

For example, the display device 10 may include two first areas A1. The display device 10 may include the first area A1 adjacent to the first hole area HA' and the first area A1 adjacent to the second hole area HA2. However, the present disclosure is not limited thereto.

The second area A2 may mean an area other than the hole area HA and the first area A1 of the display device 10 or the display panel DP in a plan view. The second area A2 may surround the hole area HA and the first area A1.

The first area A1 and the second area A2 may be display areas for displaying a screen. A display element layer including pixels may be disposed in the first area A1 and the second area A2.

However, the present disclosure is not limited thereto, and for example, pixels may also be disposed in the hole area HA, and the hole area HA may also display a screen in another embodiment.

Figure 2:
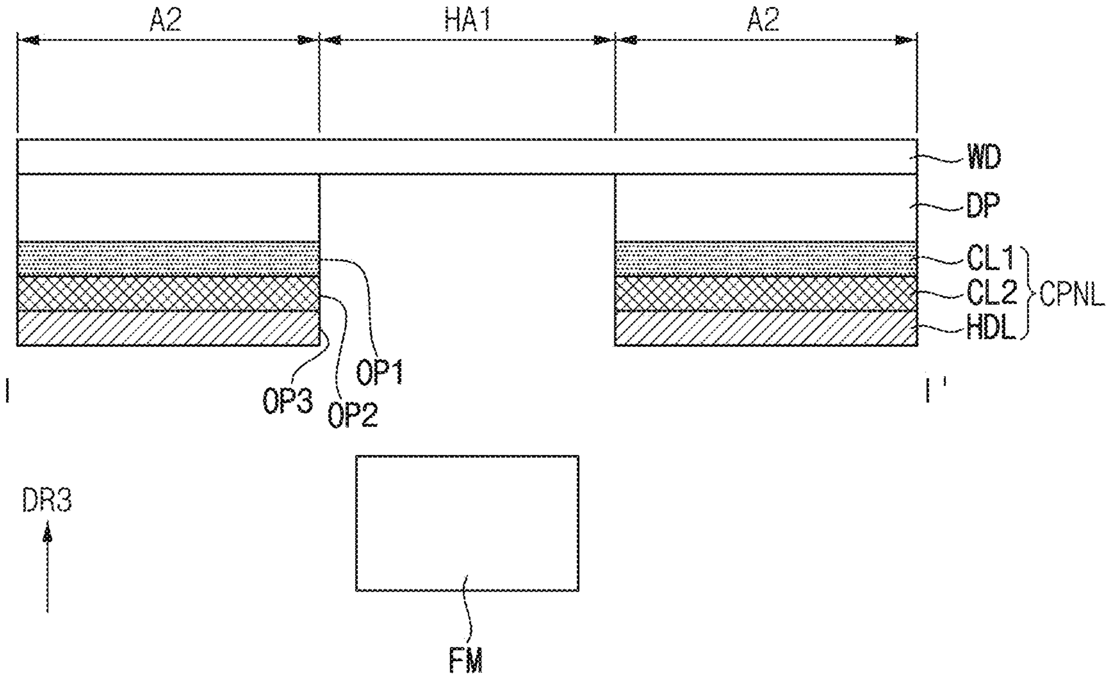
FIG. 2 is a cross-sectional view taken along line I-I' of FIG. 1.
Figure 3:
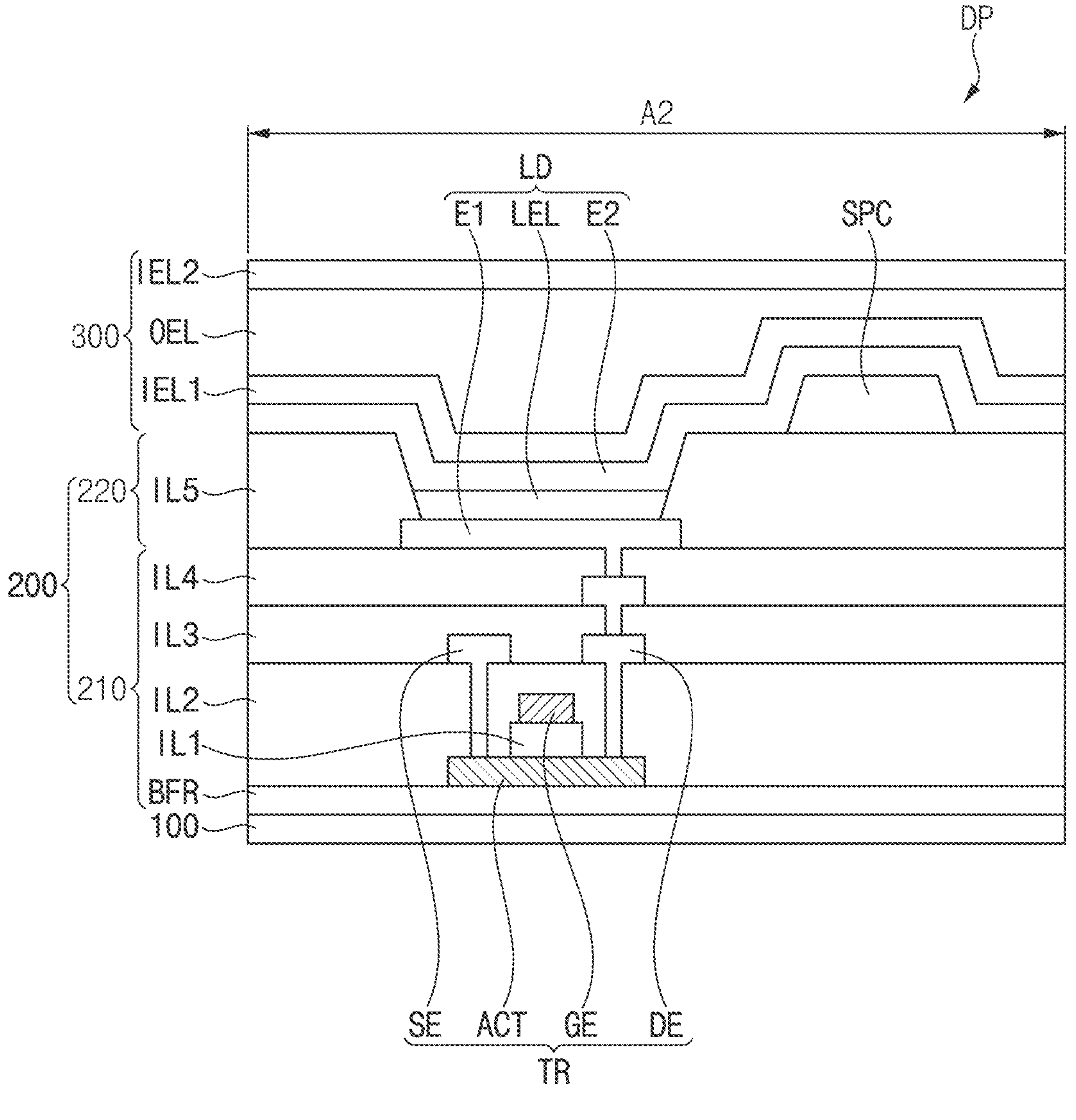
FIG. 3 is a cross-sectional view illustrating an embodiment of the display panel of FIG. 2.

FIG. 2 is a cross-sectional view taken along line I-I' of FIG. 1. FIG. 3 is a cross-sectional view illustrating an embodiment of the display panel of FIG. 2.

Referring to FIGS. 1 to 3, the display device 10 may include a display panel DP, a cover panel CPNL, a functional module FM, and a window WD.

The window WD may be disposed on the display panel DP. The window WD may be attached to the display panel DP through an adhesive layer. However, the present disclosure is not limited thereto. The window WD may protect the lower structure and allow external light to enter the functional module FM. Accordingly, the window WD may be formed of transparent glass or transparent plastic.

A polarization layer may be disposed between the window WD and the display panel DP. The polarization layer may overlap the first area A1 and the second area A2. The polarization layer may selectively transmit light emitted from the display element layer 200.

The display panel DP may include a substrate 100, a display element layer 200 and an encapsulation layer 300. As the display device 10 includes the hole area HA, the first area A1, and the second area A2, the display panel DP may also include the hole area HA, the first area A1, and the second area A2.

The substrate 100 may include a transparent or opaque material. The substrate 100 may include glass, quartz, plastic, or the like.

The display element layer 200 may be disposed in the first area A1 and the second area A2 on the substrate 100. The display element layer 200 may include a circuit element layer 210 and a light emitting element layer 220. The circuit element layer 210 may include insulation layers and conductive layers. The light emitting element layer 220 may be disposed on the circuit element layer 210. The light emitting element layer 220 may include a fifth insulation layer IL5 and a light emitting diode LD. The light emitting element layer 220 may emit light, and the circuit element layer 210 may drive the light emitting element layer 220.

The circuit element layer 210 may be disposed on the substrate 100, and include a buffer layer BFR, at least one transistor TR, a connection electrode CP, a first insulation layer IL1, and a second insulation layer IL2, a third insulation layer IL3, and a fourth insulation layer IL4. The transistor TR may include an active layer ACT, a gate electrode GE, a source electrode SE, and a drain electrode DE. The light emitting element layer 220 may be disposed on the circuit element layer 210 and may include a fifth insulation layer IL5, a spacer SPC, and a light emitting diode LD. The light emitting diode LD may include a first electrode E1, a light emitting layer LEL, and a second electrode E2.

The buffer layer BFR may be disposed on the substrate 100. The buffer layer BFR may prevent diffusion of metal atoms or impurities from the substrate 100 into the active layer ACT.

The active layer ACT may be disposed on the buffer layer BFR. The active layer ACT may be divided into a source area and a drain area doped with impurities and a channel area between the source area and the drain area.

The first insulation layer IL1 may be disposed on the active layer ACT. The first insulation layer IL1 may have an island shape. The first insulation layer IL1 may overlap the active layer ACT and the gate electrode GE and insulate the active layer ACT and the gate electrode GE. However, the present disclosure is not limited thereto.

For example, the first insulation layer IL1 may include an inorganic material.

The gate electrode GE may be disposed on the first insulation layer IL1. In an embodiment, the gate electrode GE may overlap the channel area of the active layer ACT.

The second insulation layer IL2 may be disposed on the buffer layer BFR. In addition, the second insulation layer IL2 may cover the active layer ACT, the first insulation layer ILL and the gate electrode GE, and have substantially the same thickness along the profile of the active layer ACT, the first insulation layer IL1 and the gate electrode GE. However, the present disclosure is not limited thereto.

The source electrode SE and the drain electrode DE may be disposed on the second insulation layer IL2. The source electrode SE may contact the source area of the active layer ACT through a first contact hole formed in the second insulation layer IL2. The drain electrode DE may contact the drain area of the active layer ACT through a second contact hole formed in the second insulation layer IL2.

The third insulation layer IL3 may be disposed on the second insulation layer IL2. In addition, the third insulation layer IL3 may cover the source and drain electrodes SE and DE, and have a substantially flat top surface without creating a step around the source and drain electrodes SE and DE. For example, the third insulation layer IL3 may include an organic material.

The connection electrode CP may be disposed on the third insulation layer IL3. The connection electrode CP may contact the source electrode SE or the drain electrode DE through a second contact hole formed in the third insulation layer IL3.

The fourth insulation layer IL4 may be disposed on the third insulation layer IL3. Also, the fourth insulation layer IL4 may cover the connection electrode CP and may have a substantially flat top surface without creating a step around the source and drain electrodes SE and DE. For example, the fourth insulation layer IL4 may include an organic material.

The first electrode E1 may be disposed on the fourth insulation layer IL4. The first electrode E1 may have reflective or light-transmitting properties. For example, the first electrode E1 may include metal.

The first electrode E1 may contact the connection electrode CP through a third contact hole formed in the fourth insulation layer IL4. Through this, the first electrode E1 may be connected to the transistor TR.

The fifth insulation layer IL5 may be disposed on the fourth insulation layer IL4, and an opening exposing an upper surface of the first electrode E1 may be defined in the fifth insulation layer IL5. For example, the fifth insulation layer IL5 may include an organic material or an inorganic material.

The spacer SPC may be disposed on the fifth insulation layer IL5. For example, the spacer SPC may include an organic material or an inorganic material. The spacer SPC may maintain a gap between the encapsulation layer 300 and the substrate 100.

The spacer SPC may include a material different from that of the fifth insulation layer IL5. The spacer SPC may be formed after the fifth insulation layer IL5 is formed. However, embodiments according to the present disclosure are not limited thereto, and the spacer SPC may include the same material as the fifth insulation layer IL5 in another embodiment. For example, the fifth insulation layer IL5 and the spacer SPC may include an organic material such as polyimide. Also, the fifth insulation layer IL5 and the spacer SPC may be simultaneously formed using a halftone mask.

The light emitting layer LEL may be disposed on the first electrode E1. The light emitting layer LEL may be disposed in the opening formed in the fifth insulation layer IL5. In an embodiment, the light emitting layer LEL may have a multilayer structure including a hole injection layer, a hole transport layer, an organic light emitting layer, an electron transport layer, and an electron injection layer. The organic light emitting layer may include a light emitting material.

The second electrode E2 may cover the light emitting layer LEL and be disposed on the fifth insulation layer IL5 and the spacer SPC. In an embodiment, the second electrode E2 may have a plate shape. In addition, the second electrode E2 may have light transmitting or reflecting properties. For example, the second electrode E2 may include metal.

The encapsulation layer 300 may prevent moisture and oxygen from penetrating into the light emitting diode LD from the outside. For example, the encapsulation layer 300 may include a first inorganic encapsulation layer IEL1, an organic encapsulation layer OEL, and a second inorganic encapsulation layer IEL2.

The first inorganic encapsulation layer IEL1 may be disposed on the second electrode E2 with substantially the same thickness along the profile of the second electrode E2. The organic encapsulation layer OEL may be disposed on the first inorganic encapsulation layer IEL1, and have a substantially flat top surface without creating a step around the first inorganic encapsulation layer IEL1. The second inorganic encapsulation layer IEL2 may be disposed on the organic encapsulation layer OEL.

The cover panel CPNL may be disposed under the display panel DP. The cover panel CPNL may include a first cover layer CL1, a second cover layer CL2, and a heat dissipation layer HDL. The cover panel CPNL may perform a heat dissipation function and a shock absorption function. As the display device 10 includes the hole area HA, the first area A1, and the second area A2, the cover panel CPNL may also include the hole area HA, the first area A1, and the second area A2.

The first cover layer CL1 may be disposed under the substrate 100. The first cover layer CL1 may overlap the first area A1 and the second area A2. The first cover layer CL1 may include a first opening OP1 defined in the hole area HA.

The first cover layer CL1 may include an acrylic resin. The first cover layer CL1 may function as a light blocking layer. Accordingly, the first cover layer CL1 may further include a light blocking material such as black dye or black pigment. The first cover layer CL1 may prevent external light from entering the display device 10.

The second cover layer CL2 may be disposed under the first cover layer CL1. The second cover layer CL2 may overlap the first area A1 and the second area A2. The second cover layer CL2 may include a second opening OP2 defined in the hole area HA. The second opening OP2 may overlap the first opening OP1.

The second cover layer CL2 may include an acrylic resin. The second cover layer CL2 may perform a shock absorption function. The second cover layer CL2 may improve impact resistance of the display device 10 by absorbing an external impact.

The heat dissipation layer HDL may be disposed under the second cover layer CL2. The heat dissipation layer HDL may overlap the first area A1 and the second area A2. The heat dissipation layer HDL may include a third opening OP3 defined in the hole area HA. The third opening OP3 may overlap the first opening OP1 and the second opening OP2 and form one opening together with the opening of the display panel DP.

The heat dissipation layer HDL may include metal. For example, the heat dissipation layer HDL may include copper. The heat dissipation layer HDL may perform a heat dissipation function. The heat dissipation layer HDL may insulate heat generated from the display panel DP and external heat from each other.

The display panel DP and the cover panel CPNL may include an opening overlapping the hole area HA. A filling layer may be disposed in the opening of the display panel DP, the first opening OP1 of the first cover layer CL1, and the second opening OP2 of the second cover layer CL2 overlapping the hole area HA. The filling layer may fill the opening. Since the hole area HA is a light-transmitting area, light may pass through the display panel DP through the opening. Accordingly, the light may be incident to the functional module positioned under the display panel DP through the opening.

The functional module FM may be disposed under the cover panel CPNL. The functional module FM may overlap the hole area HA. Examples of the functional module may include a camera module, a face recognition sensor module, a pupil recognition sensor module, an acceleration sensor module, a proximity sensor module, an infrared sensor module, an illuminance sensor module, and a fingerprint detection module. The camera module may be a module that captures (or recognizes) an image of an object located in front of the display device. The face recognition sensor module may be a module that detects a user's face. The pupil recognition sensor module may be a module that detects the pupil of the user. The acceleration sensor module and the geomagnetic sensor module may be modules that determine the movement of the display device. The proximity sensor module and the infrared sensor module may be modules that detect proximity of the front of the display device. The illuminance sensor module may be a module that measures the degree of external brightness. The fingerprint detection module may be a module that detects a human fingerprint.

For example, the functional module overlapping the first hole area HA1 may be the camera module. Accordingly, the camera module may be disposed in an area overlapping the first hole area HA1.

For example, the functional module overlapping the second hole area HA2 may be the camera module or the infrared sensor module. Accordingly, the camera module or the infrared sensor module may be disposed in an area overlapping the second hole area HA2.

For example, the functional module overlapping the third hole area HA3 may be the fingerprint sensing module. Accordingly, the fingerprint sensing module may be disposed in an area overlapping the third hole area HA3.

However, the present disclosure is not limited thereto.

Figure 4:
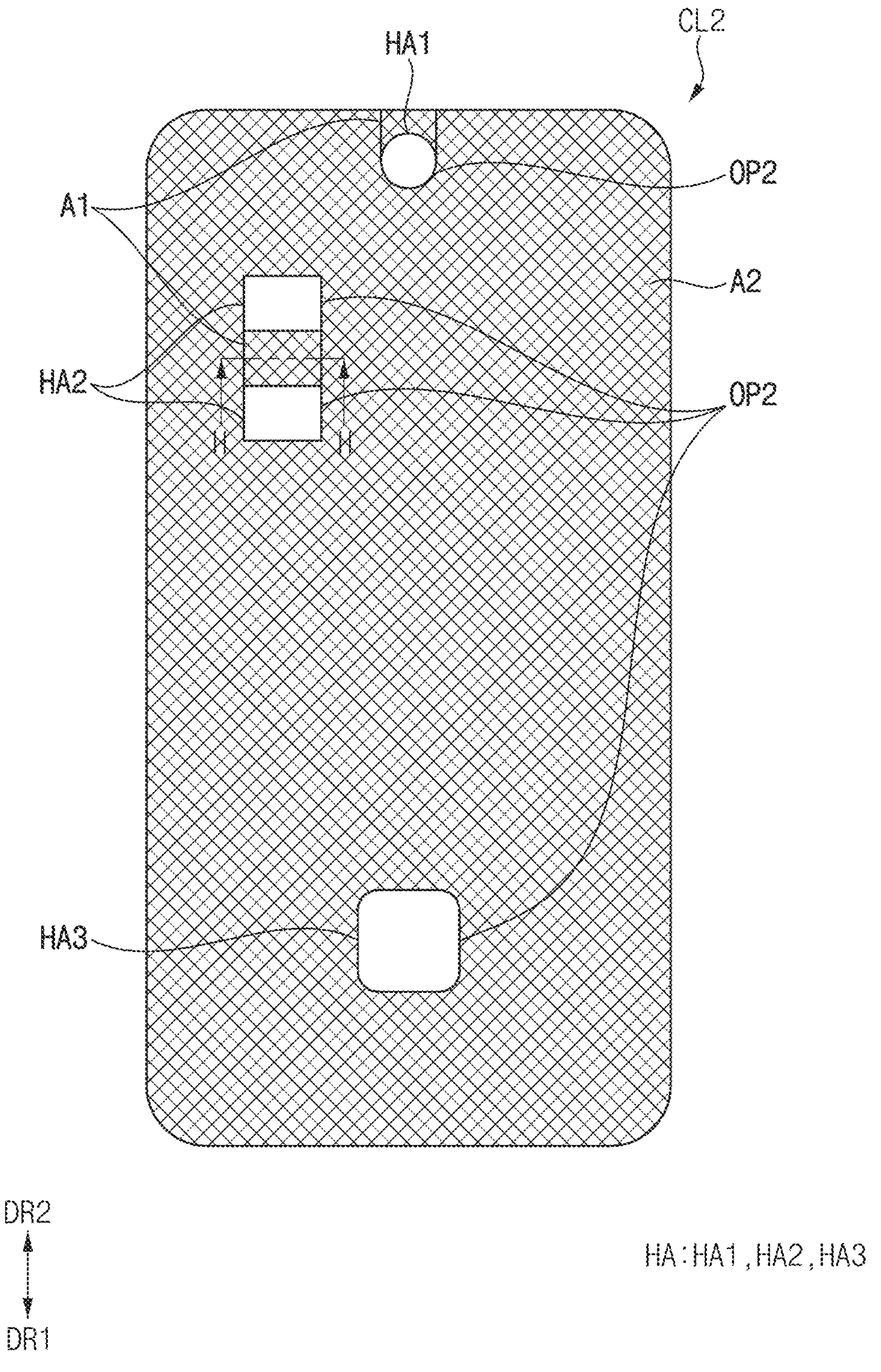
FIG. 4 is a plan view illustrating a second cover layer included in the display device of FIG. 2.
Figure 5:
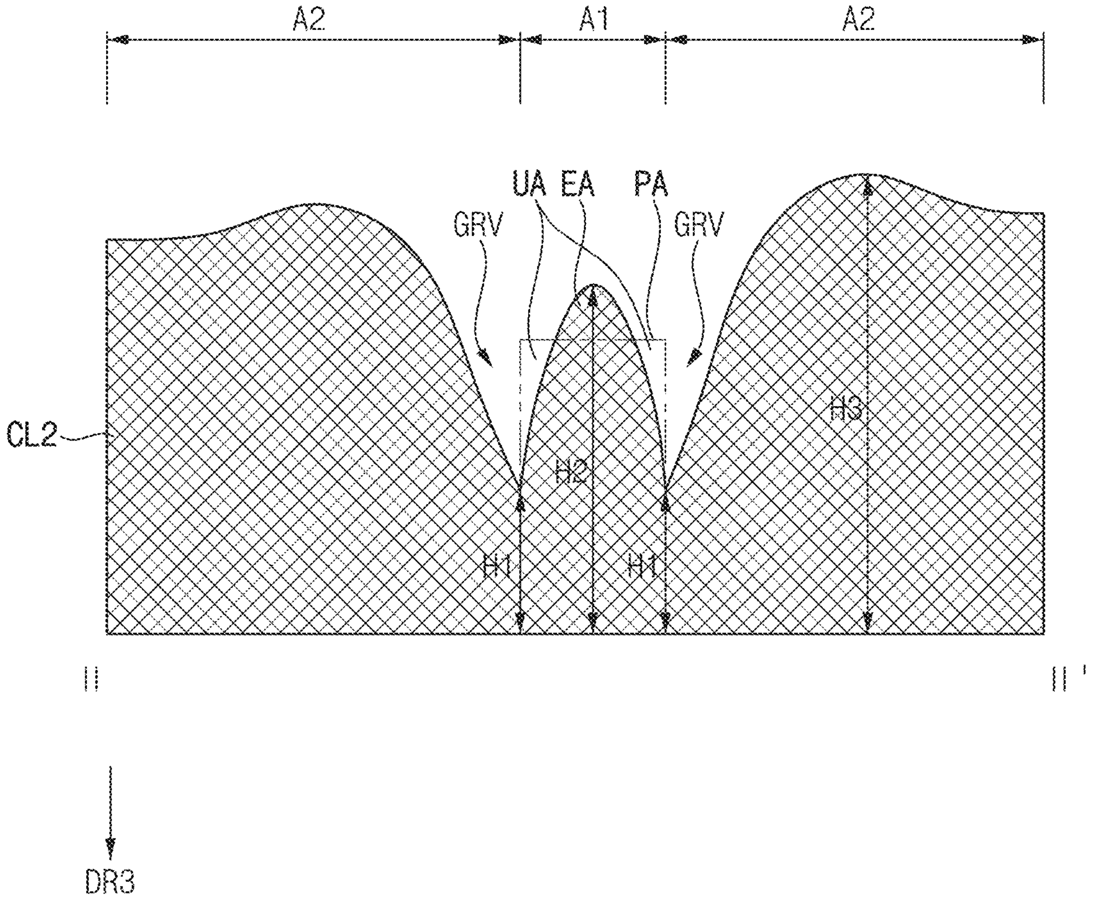
FIG. 5 is a cross-sectional view taken along line II-IF of FIG. 4.

FIG. 4 is a plan view illustrating a second cover layer included in the display device of FIG. 2. FIG. 5 is a cross-sectional view taken along line II-IF of FIG. 4. Here, FIG. is a bottom-up view compared to FIG. 2.

Further referring to FIGS. 4 and 5, the second cover layer CL2 may include a groove GRV.

In an embodiment, the groove GRV may be defined along a boundary between the first area A1 and the second area A2 in the second cover layer CL2. The groove GRV may be formed in the second cover layer CL2 along the first direction DR1.

For example, the groove GRV may be formed at a boundary between the first area A1 and the second area A2 adjacent to the first hole area HAL Also, the groove GRV may be formed at a boundary between the first area A1 and the second area A2 adjacent to the second hole area HA2.

In an embodiment, a first height H1 of the second cover layer CL2 positioned at the boundary between the first area A1 and the second area A2 may be smaller than a second height H2 of the second cover layer CL2 overlapping the first area A1 in a thickness direction (i.e., third direction DR3) of the display device 10. That is, the first height H1 of the second cover layer CL2 overlapping the groove GRV may be smaller than the second height H2 of the second cover layer CL2 overlapping the first area A1 in the thickness direction of the display device 10. Here, the second height H2 may be the maximum height of the second cover layer CL2 overlapping the first area A1.

The first height H1 of the second cover layer CL2 positioned at the boundary between the first area A1 and the second area A2 may be smaller than a third height H3 of the second cover layer CL2 overlapping the second area A2 in the thickness direction (i.e., third direction DR3) of the display device 1. That is, the first height H1 of the second cover layer CL2 overlapping the groove GRV may be smaller than the third height H3 of the second cover layer CL2 overlapping the second area A2 in the thickness direction of the display device 1. Here, the second height H2 may be the maximum height of the second cover layer CL2 overlapping the second area A2.

Through this, since the height of the portion overlapping the groove GRV in the second cover layer CL2 is relatively small compared to other portions, the groove GRV may be visually recognized in a plan view. Accordingly, the boundary between the first area A1 and the second area A2 may be visually recognized.

In an embodiment, the shape matching ratio of the second cover layer CL2 overlapping the first area A1 may be about 60% or more. Accordingly, a gap between the second height H2 of the second cover layer CL2 overlapping the first area A1 and the third height H3 of the second cover layer CL2 overlapping the second area A2 may be reduced. Accordingly, impact resistance of the second cover layer CL2 in the first area A1 may be improved. Accordingly, reliability of the display device 10 may be effectively improved. The shape matching ratio will be described in more detail with reference to FIG. 14.

FIGS. 6 to 13 are diagrams illustrating a method of manufacturing a display device according to an embodiment of the present disclosure.

For example, a method for manufacturing a display device described with reference to FIGS. 6 to 13 may be a method for manufacturing the display device 10 described with reference to FIGS. 1 to 5. Therefore, redundant descriptions may be omitted.

Figure 6:
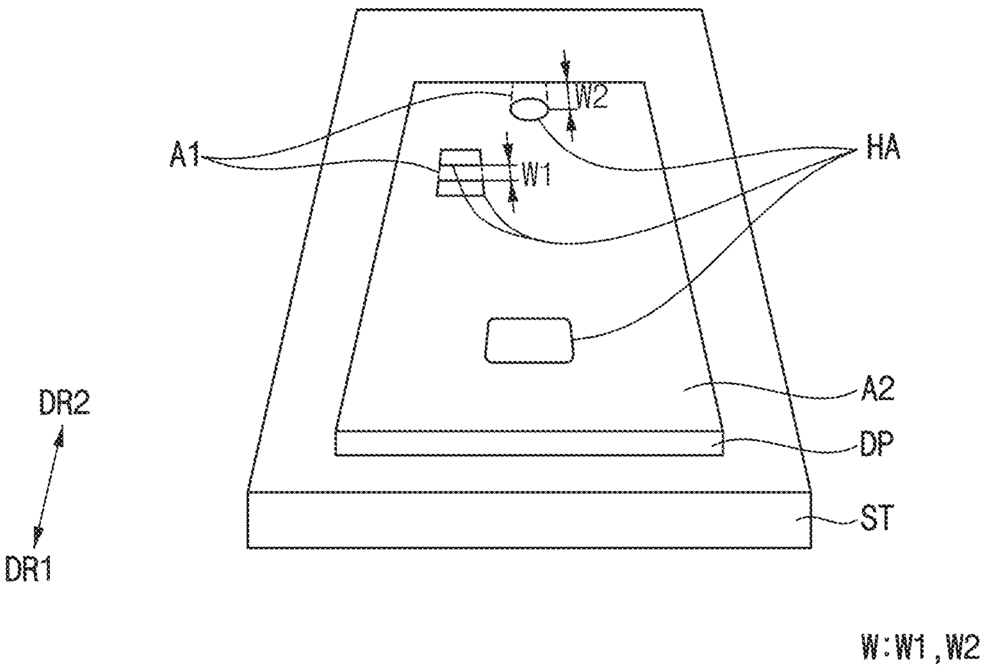
FIGS. 6 to 13 are diagrams illustrating a method of manufacturing a display device according to an embodiment of the present disclosure.

Referring to FIG. 6, a display panel DP may be disposed on the stage ST. A surface on which the substrate 100 of the display panel DP is positioned may be a rear surface of the display panel DP. The display panel DP may be disposed on the stage ST such that the rear surface of the display panel DP faces upward and an upper surface opposite to the rear surface of the display panel DP faces downward to contact the stage ST.

The display panel DP may include the hole area HA, the first area A1, and the second area A2. Openings each overlapping the hole area HA may be formed in the display panel DP.

The first area A1 may be adjacent to the hole area HA in the second direction DR2. A width W of the first area A1 in the second direction DR2 from the hole area HA may be about 4 mm or less.

Figure 7:
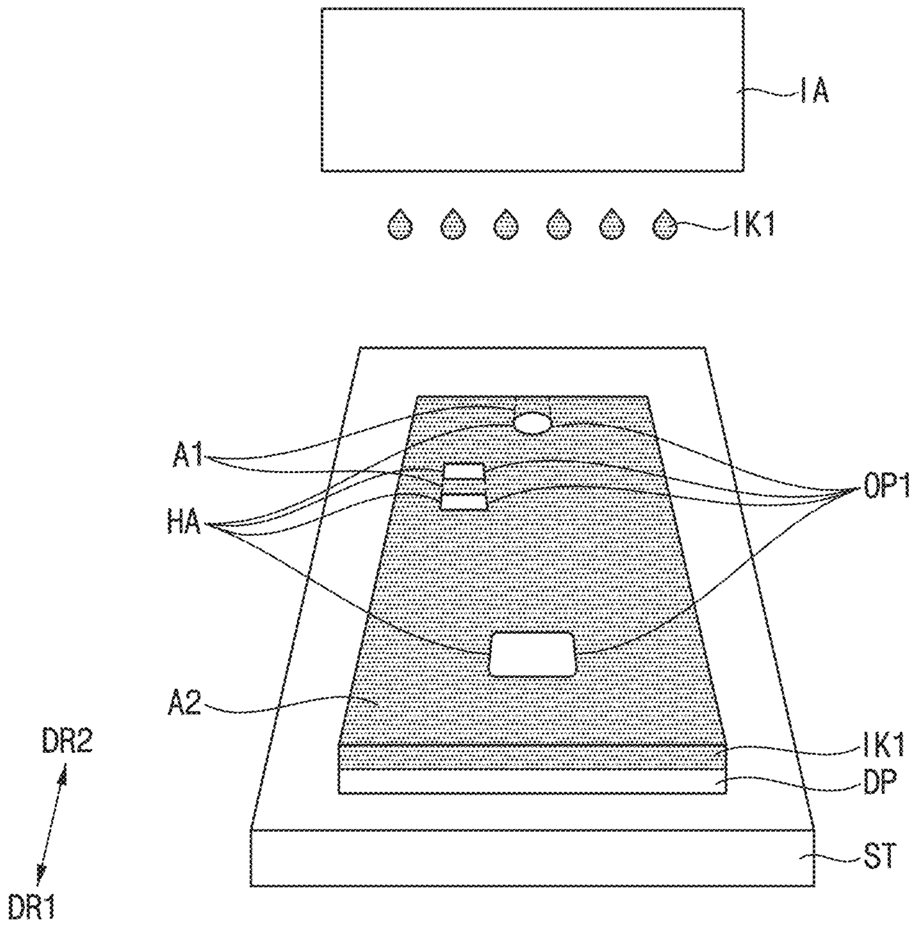

Referring further to FIG. 7, an inkjet device IA may be positioned on the display panel DP. The stage ST may move the display panel DP below the inkjet device IA. However, the present disclosure is not limited thereto, and the inkjet device IA may move onto the display panel DP on the stage ST in another embodiment.

The inkjet device IA may apply a first ink IK1 on the display panel DP in the first direction DR1 since the stage ST moves in the second direction DR2. However, the present disclosure is not limited thereto, and the inkjet device IA may apply the first ink IK1 on the display panel DP in the second direction DR2, and the stage ST may move in the first direction DR1 in another embodiment. Here, the second direction DR2 is a direction opposite to the first direction DR1.

Specifically, the inkjet device IA may apply the first ink IK1 to the first area A1 and the second area A2 on the substrate 100. That is, the inkjet device IA may not apply the first ink IK1 to the hole area HA.

The first ink IK1 may include an acrylic resin. The first ink IK1 may further include a light-blocking material such as black dye or black pigment.

Figure 8:
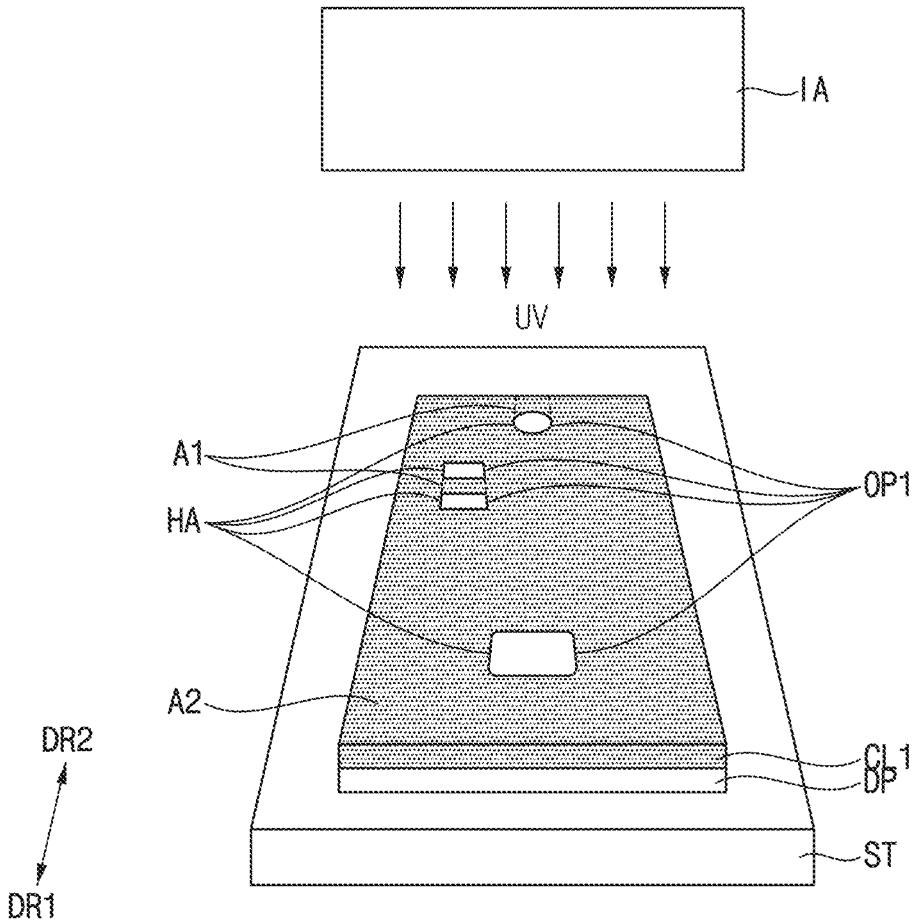

Referring further to FIG. 8, the inkjet device IA may cure the first ink IK1. The inkjet device IA may irradiate the first ink IK1 with ultraviolet light to cure the first ink IK1. The first cover layer CL1 may be formed by curing the first ink IK1. Since the first ink IK1 is not applied to the hole area HA, the first cover layer CL1 may define a first opening OP1 therein overlapping the hole area HA.

Figure 9:
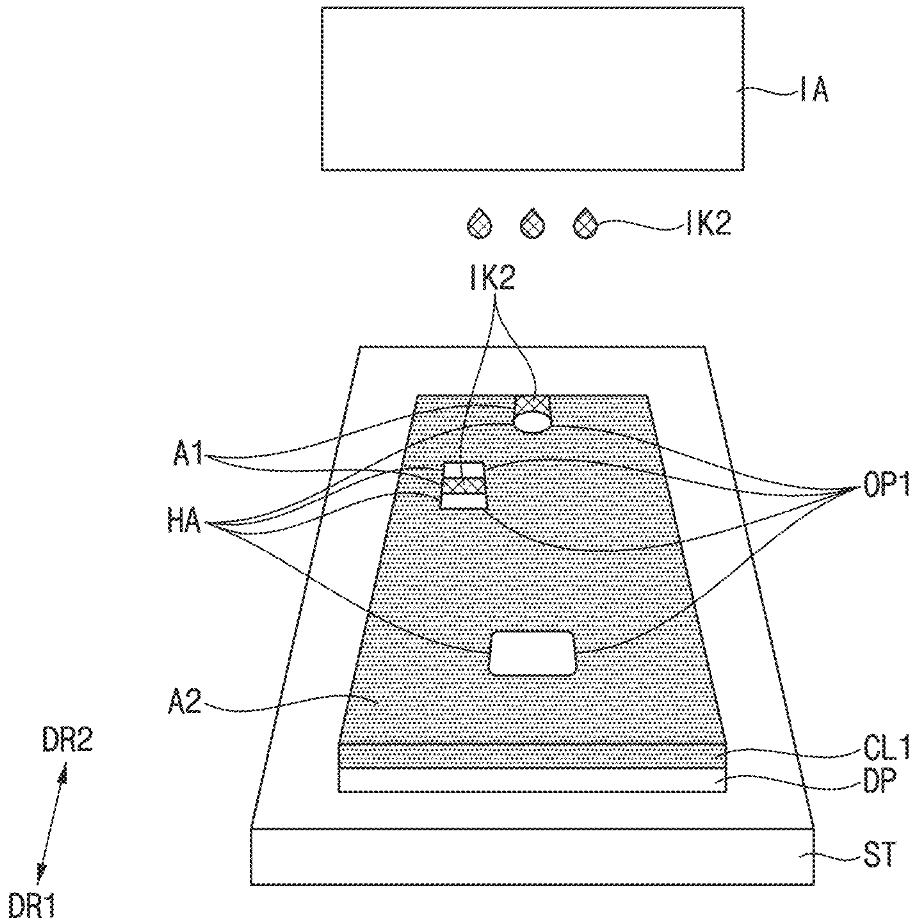

Referring further to FIG. 9, in an embodiment, the inkjet device IA may apply a second ink IK2 to the first area A1 in the first direction DR1. That is, the inkjet device IA may apply the second ink IK2 only to the first area A1 on the first cover layer CL1. That is, the second ink IK2 may not be applied to the hole area HA and the second area A2.

The second ink IK2 may include an acrylic resin.

Figure 10:
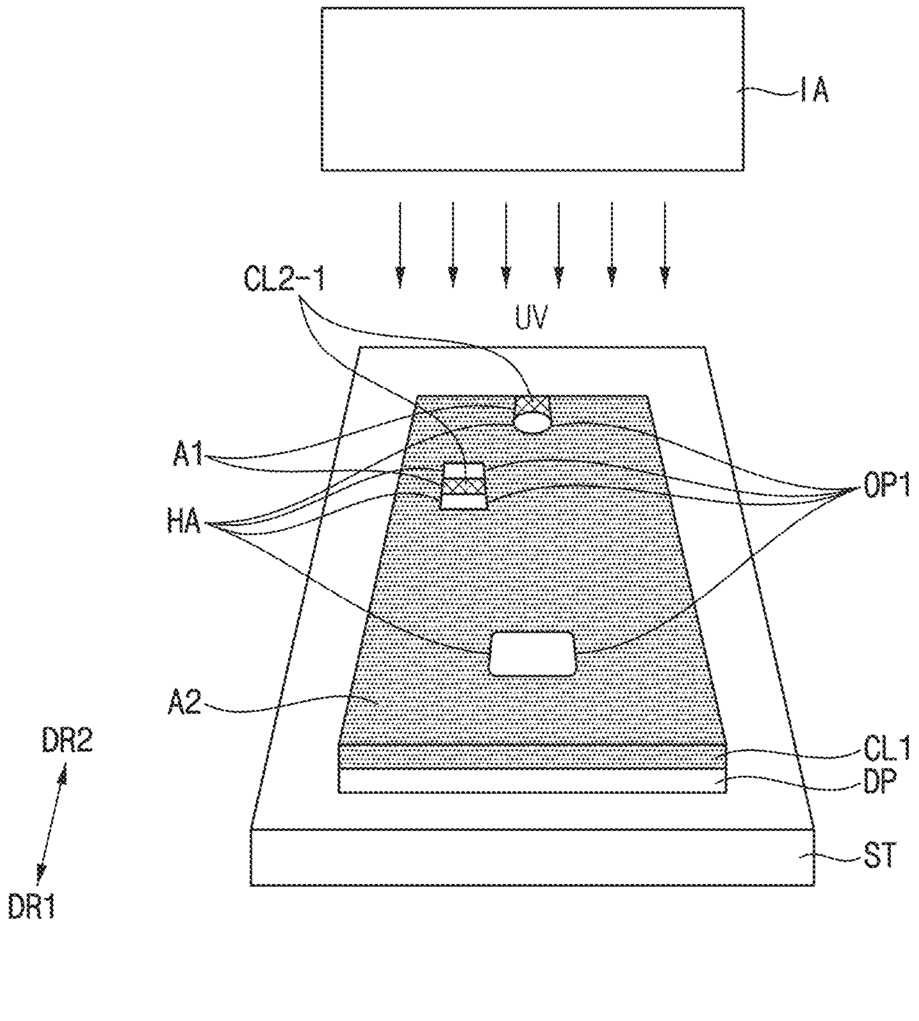

Referring further to FIG. 10, the inkjet device IA may cure the second ink IK2. The inkjet device IA may irradiate UV light to the second ink IK2 disposed in the first area A1 to cure the second ink IK2. A first portion CL2-1 of the second cover layer CL2 overlapping the first area A1 may be formed by curing the second ink IK2.

Figure 11:
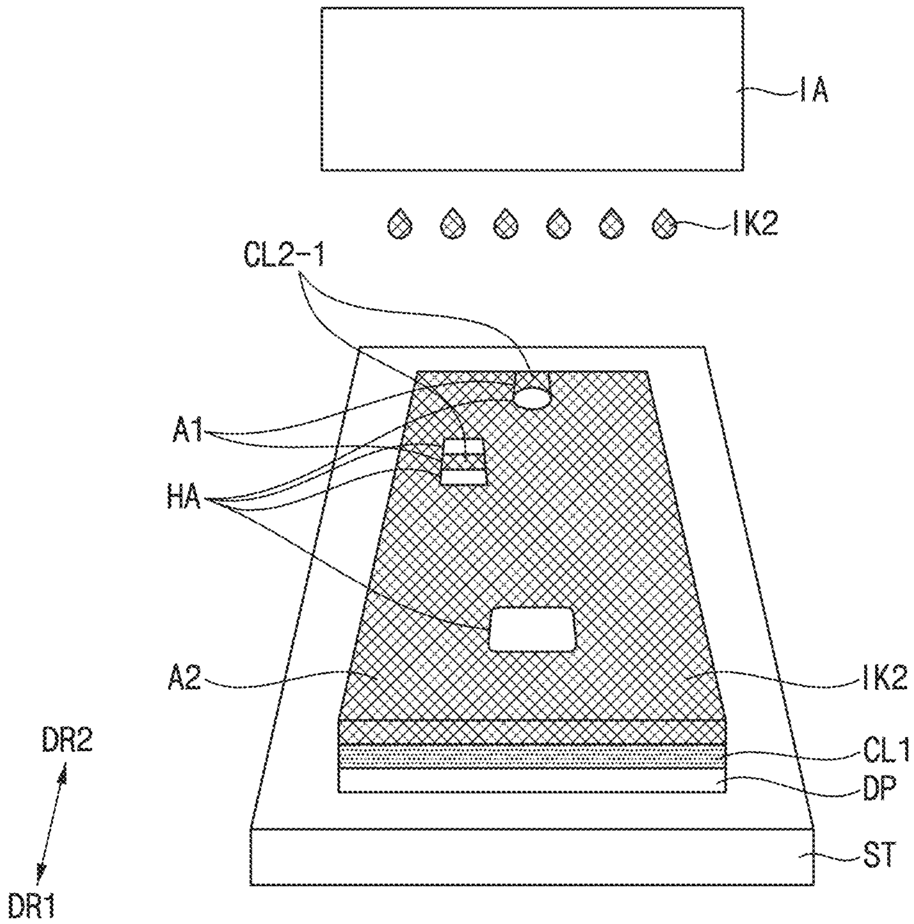

Referring further to FIG. 11, the inkjet device IA may apply the second ink IK2 to the second area A2 in the first direction DR1. However, the present disclosure is not limited thereto, and the inkjet device IA may apply the second ink IK2 to the second area A2 in the second direction DR2 in another embodiment. The inkjet device IA may apply the second ink IK2 only to the second area A2 on the first cover layer CL1 in this stage.

Figure 12:
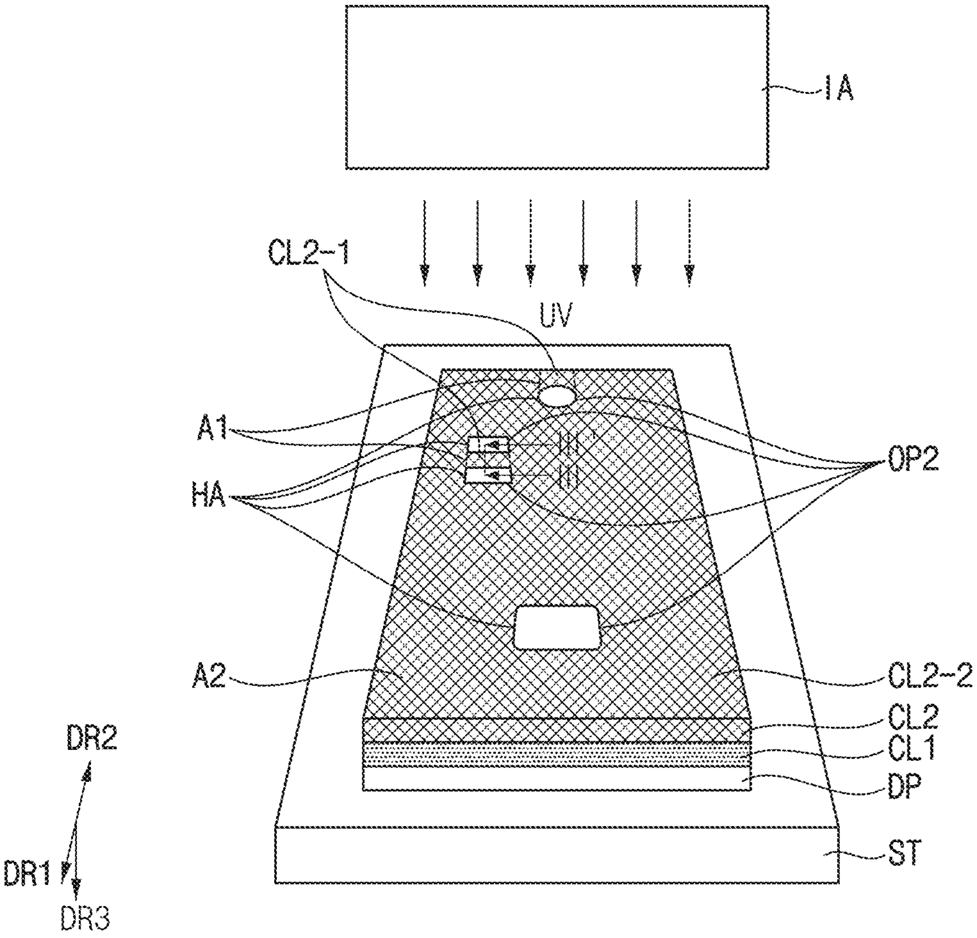

Referring further to FIG. 12, the inkjet device IA may cure the second ink IK2. The inkjet device IA may irradiate UV light to the second ink IK2 disposed in the second area A2 to cure the second ink IK2. A second portion CL2-2 of the second cover layer CL2 overlapping the second area A2 may be formed by curing the second ink IK2.

In an embodiment, after the first portion CL2-1 of the second cover layer CL2 is formed in the first area A1, the second portion CL2-2 of the second cover layer CL2 is formed in the second area A2, so that the second cover layer CL2 may be formed. Since the second ink IK2 is not applied to the hole area HA, the second cover layer CL2 may define a second opening OP2 therein overlapping the hole area HA.

In an embodiment, the applying of the second ink IK2 to the first area A1 and the applying of the second ink IK2 to the second area A2 may be performed separately. Accordingly, the shape matching ratio of the second cover layer CL2 overlapping the first area A1 may be about 60% or more.

Figure 13:
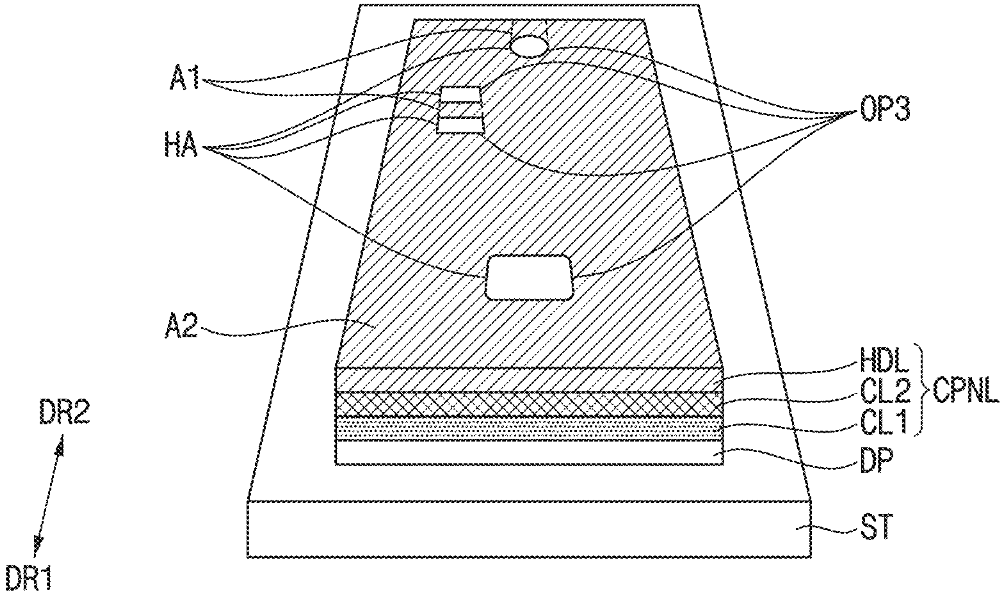

Referring further to FIG. 13, a heat dissipation layer HDL may be formed on the second cover layer CL2. The heat dissipation layer HDL may overlap the first area A1 and the second area A2 and may define a third opening OP3 therein overlapping the hole area HA. The heat dissipation layer HDL may be formed of or include copper. Accordingly, the cover panel CPNL may be formed on the display panel DP by sequentially forming the first cover layer CL1, the second cover layer CL2, and the heat dissipation layer HDL.

Figure 14:
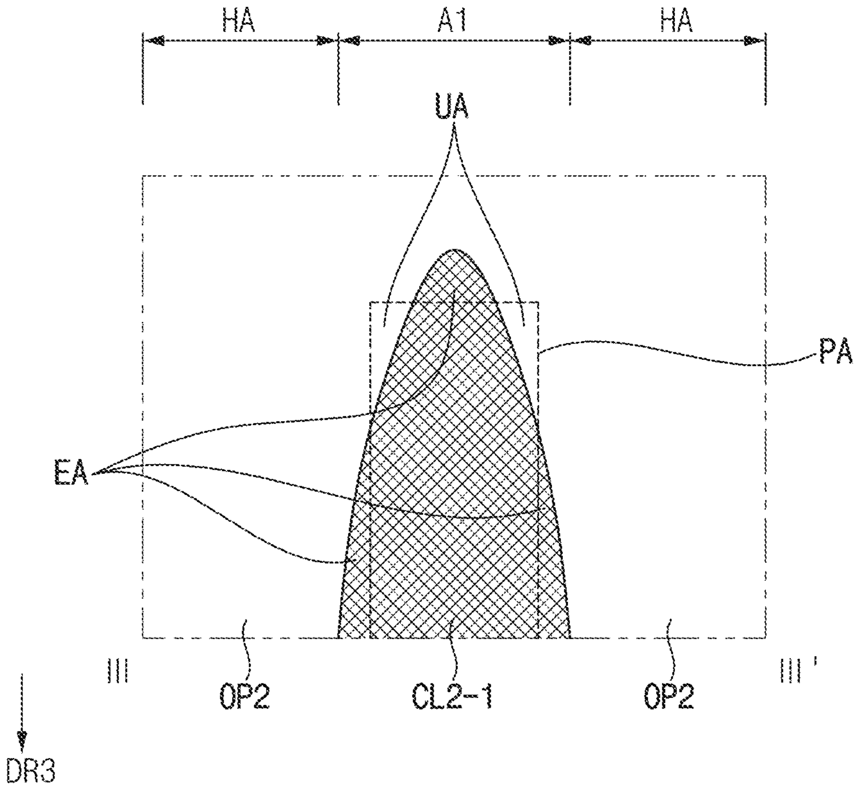
FIG. 14 is a cross-sectional view taken along line of FIG. 12.

FIG. 14 is a cross-sectional view taken along line of FIG. 12.

For example, FIG. 14 may be a cross-sectional view showing only the second cover layer CL2 in FIG. 12.

Referring to FIG. 14, in an embodiment, the shape matching ratio of the second cover layer CL2 overlapping the first area A1 may be about 60% or more. The shape matching ratio may be a numerical value (unit: percentages (%)) representing closeness of an area of an actual object (i.e., the first portion CL2-1 of the second cover layer CL2) to an area of a target shape. In addition, the shape matching ratio may be a numerical value representing a ratio related to an area of the applied and cured ink compared to an area of an existing material.

Specifically, the shape matching ratio may be according to Equation 1 below:

$$\left(1 - \frac{EA + UA}{PA}\right) * 100(\%), \quad \text{[Equation 1]}$$

Here, PA is an area of a target shape in a cross-sectional view (hereinafter "preset area"), EA is an area of a portion of an actual object outside the target area in the cross-sectional view (hereinafter "excess area"), and UA is an area of a portion of the target shape not filled with the actual object in the cross-sectional view (hereinafter "non-filled area").

When calculating the shape matching ratio, it may be calculated by measuring the profile of the upper surface of the object to be measured in a cross section passing through the center of the area to be measured. For example, when calculating the shape matching ratio of the second cover layer CL2, it may be calculated by measuring the profile of the upper surface of the second cover layer CL2 in a cross section passing through the center of the first area A1 to be measured.

When measuring the shape matching ratio, the area of the preset area PA may be obtained by measuring the area of an existing material or measuring the area of a target area. In addition, when measuring the shape matching ratio, the area of the excess area EA compared to the preset area PA may be obtained by measuring the area of the protruding portion of the object to be measured beyond the preset area PA. In addition, when measuring the shape matching ratio, the area of the non-filled area UA compared to the preset area PA may be obtained by measuring the area of the portion of the object to be measured that is not filled as much as the preset area PA.

For example, when calculating the shape matching ratio of the second cover layer CL2, the area of the preset area PA may be obtained by measuring the area of an existing material that is not formed using the inkjet method. The area of the excess area EA compared to the preset area PA may be obtained by measuring the area of the protruding portion of the second cover layer CL2 beyond the preset area PA. Also, the area of the non-filled area UA compared to the preset area PA may be obtained by measuring the area of the unfilled portion of the second cover layer CL2 compared to the preset area PA.

In an embodiment, the second cover layer CL2 overlapping the first area A1 may have the shape matching ratio of about 60% or more. Accordingly, the height of the first portion CL2-1 of the second cover layer CL2 overlapping the first area A1 may be secured above a certain height. Also, the height of the first portion CL2-1 of the second cover layer CL2 may not have a relatively large gap from the height of the second portion CL2-2 of the second cover layer CL2. Accordingly, impact resistance of the second cover layer CL2 in the first area A1 may be improved. Accordingly, reliability of the display device may be effectively improved.

Figure 15:
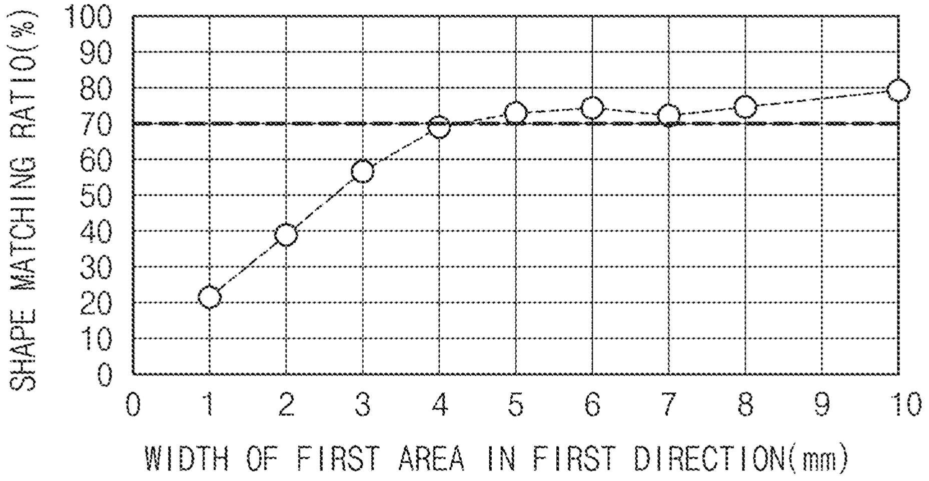
FIG. 15 is a graph for explaining a shape matching ratio according to a width of a first area in a first direction.

FIG. 15 is a graph for explaining a shape matching ratio according to a width of a first area in a first direction.

For example, in the graph of FIG. 15, when the second layer CL2 is formed, especially, when the first portion CL2-1 overlapping the first area A1 and the second portion CL2-2 overlapping the second area A2 is formed at the same time, it may be a graph obtained by measuring the shape matching ratio according to the width of the first area A1 in the second direction DR2.

Referring more easily to FIG. 15, the shape matching ratio may be increased as the width of the first area A1 in the second direction DR2 becomes larger.

When the width of the first area A1 in the second direction DR2 is about 4 mm or less, when the first portion CL2-1 and the second portion CL2-2 of the second cover layer CL2 are formed at the same time, the shape matching ratio of the first portion CL2-1 may be about 60% or less. Accordingly, the height of the first portion CL2-1 of the second cover layer CL2 may be relatively smaller than the height of the second portion CL2-2 of the second cover layer CL2. Accordingly, the impact resistance of the second cover layer CL2 in the first area A1 may deteriorate, and the reliability of the display device may deteriorate.

However, when the width of the first area A1 in the second direction DR2 exceeds about 4 mm, even if the first portion CL2-1 and the second portion CL 2-2 of the second cover layer CL2 are formed at the same time, the shape matching ratio of the first portion CL2-1 may be about 70% or more. Accordingly, the height of the first portion CL2-1 of the second cover layer CL2 may be relatively similar to the height of the second portion CL2-2 of the second cover layer CL2. Accordingly, the impact resistance of the second cover layer CL2 in the first area A1 may be secured, and the reliability of the display device may be secured.

When the second cover layer CL2 overlapping each of the first area A1 having a width of about 4 mm or less in the second direction DR2 and the second area A2 is simultaneously formed, the second inks disposed in the second area A2 may attract the second inks disposed in the first area A1 according to van der Waals' law. Accordingly, the shape matching ratio of the first portion CL2-1 of the second cover layer CL2 disposed in the first area A1 may be decreased.

Therefore, in an embodiment, only an area having a width of about 4 mm or less in the second direction DR2 may be defined as the first area A1, and when forming the second cover layer CL2, only the area having the width of about 4 mm or less in the second direction DR2 may be formed separately from the second area A2.

In an embodiment, the first cover layer CL1 and the second cover layer CL2 are formed by applying the first ink IK1 and the second ink IK2 using the inkjet device IA, respectively. By doing so, costs may be reduced during the manufacturing process of the display device, and manufacturing costs may be reduced.

In addition, the applying of the second ink IK2 to the first area A1 and the applying of the second ink IK2 to the second area A2 are performed separately, so that the shape matching ratio of the second cover layer CL2 overlapping the first area A1 may be about 60% or more. Accordingly, the impact resistance of the second cover layer CL2 in the first area A1 may be secured, and the reliability of the display device may be secured.

FIGS. 16 to 19 are views illustrating a method for manufacturing a display device according to an embodiment of the present disclosure.

For example, a method for manufacturing the display device described with reference to FIGS. 16 to 19 is substantially equal to the method for manufacturing of the display device described with reference to FIGS. 6 to 13 except for a formation order of the first portion CL2-1 and the second portion CL2-2 of the second cover layer CL2. Therefore, redundant descriptions may be omitted.

Figure 16:
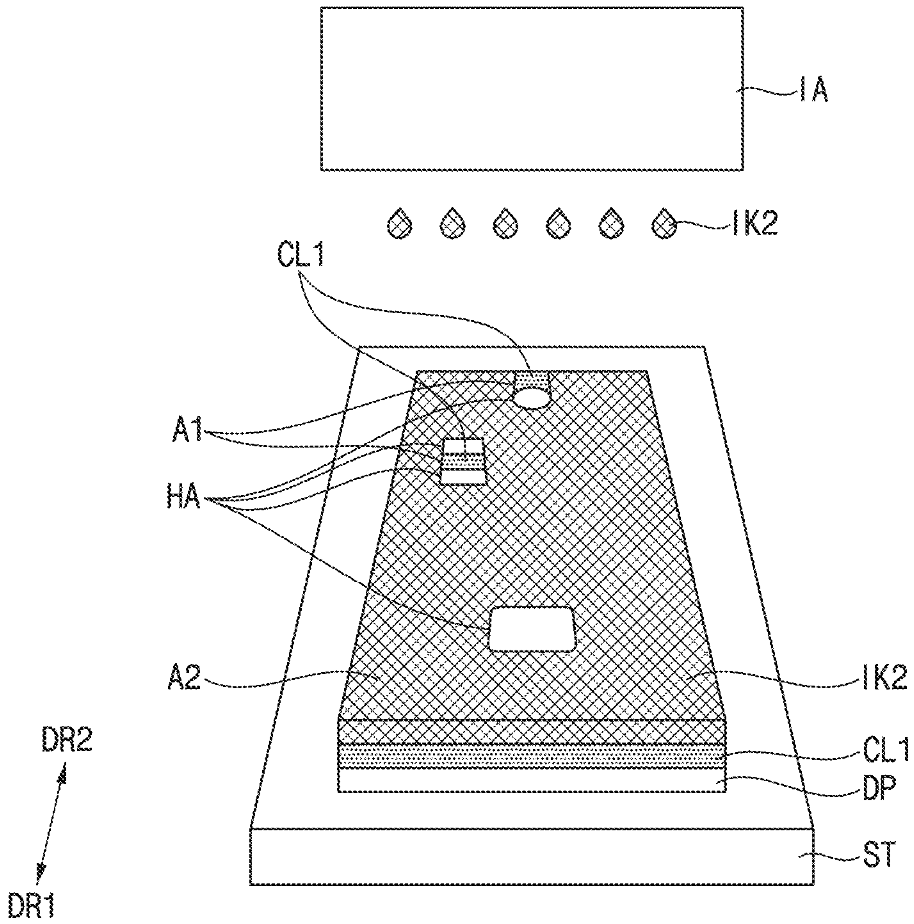
FIGS. 16 to 19 are views illustrating a method for manufacturing a display device according to an embodiment of the present disclosure.

Referring to FIG. 16, the inkjet device IA may apply the second ink IK2 to the second area A2 in the first direction DR1. That is, the inkjet device IA may apply the second ink IK2 only to the second area A2 on the first cover layer CL1. That is, the second ink IK2 may not be applied to the hole area HA and the first area A1.

Figure 17:
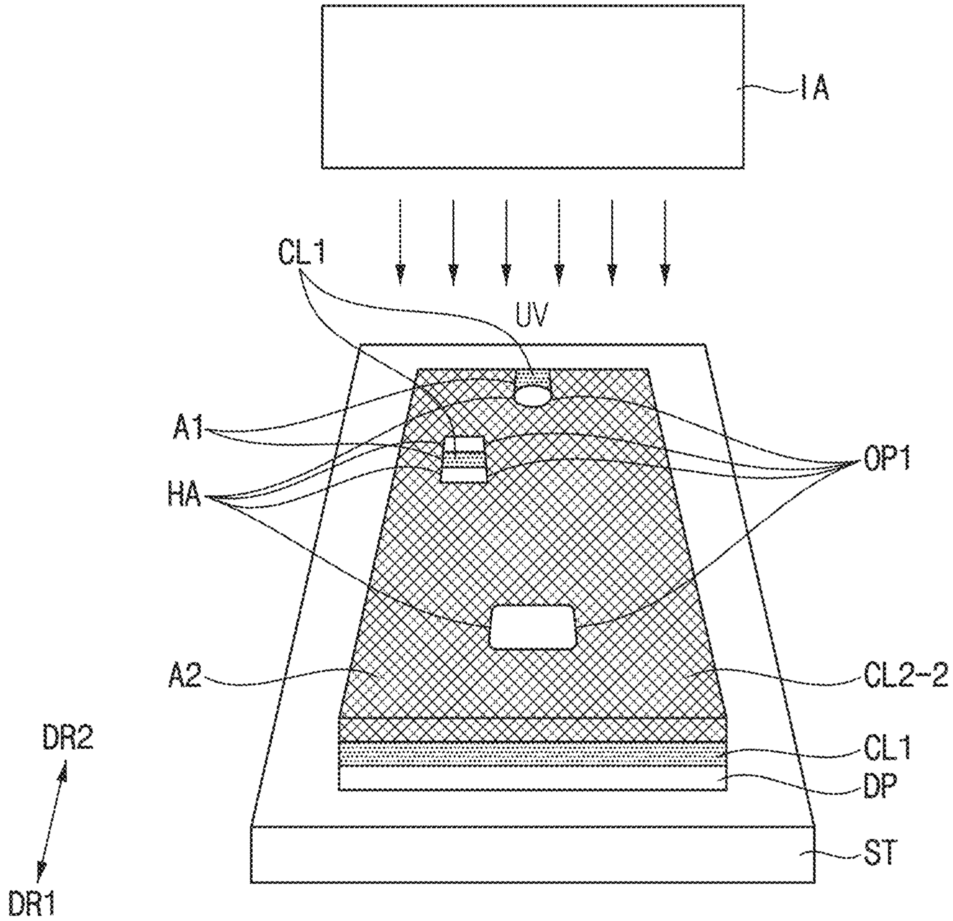

Referring further to FIG. 17, the inkjet device IA may cure the second ink IK2. The inkjet device IA may irradiate UV light to the second ink IK2 disposed in the second area A2 to cure the second ink IK2. The second portion CL2-2 of the second cover layer overlapping the second area A2 may be formed by curing the second ink IK2.

Figure 18:
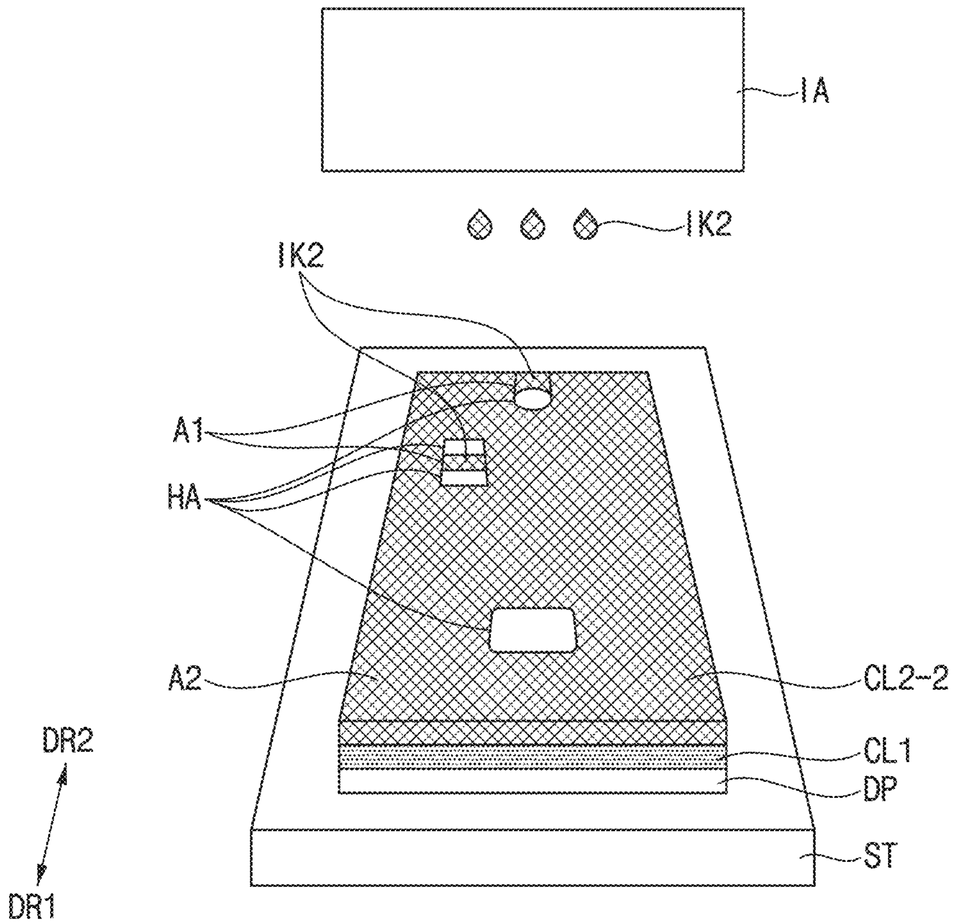

Referring further to FIG. 18, the inkjet device IA may apply the second ink IK2 to the first area A1 in the first direction DR1. However, the present disclosure is not limited thereto, and the inkjet device IA may apply the second ink IK2 to the first area A1 in the second direction DR2 in another embodiment. That is, the inkjet device IA may apply the second ink IK2 only to the first area A1 on the first cover layer CL1.

Figure 19:
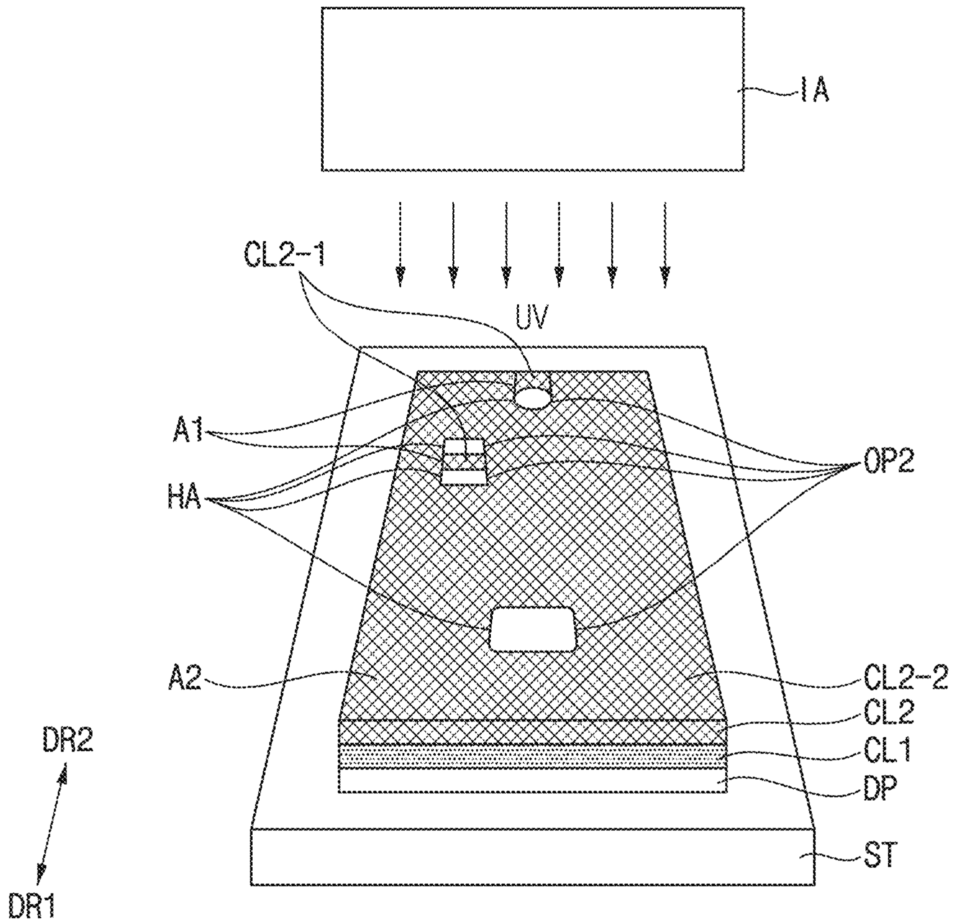

Referring further to FIG. 19, the inkjet device IA may cure the second ink IK2. The inkjet device IA may irradiate UV light to the second ink IK2 disposed in the first area A1 to cure the second ink IK2. The first portion CL2-1 of the second cover layer overlapping the first area A1 may be formed by curing the second ink IK2.

In an embodiment, after the second portion CL2-2 of the second cover layer CL2 is formed in the second area A2, the first portion CL2-1 of the second cover layer CL2 is formed, so that the second cover layer CL2 may be formed. Since the second ink IK2 is not applied to the hole area HA, the second cover layer CL2 may include a second opening OP2 overlapping the hole area HA.

In an embodiment, the applying of the second ink IK2 to the first area A1 and the applying of the second ink to the second area A2 may be performed separately. Accordingly, the shape matching ratio of the second cover layer CL2 overlapping the first area A1 may be about 60% or more. Impact resistance of the second cover layer CL2 in the first area A1 may be secured, and reliability of the display device may be secured.

Figure 20:
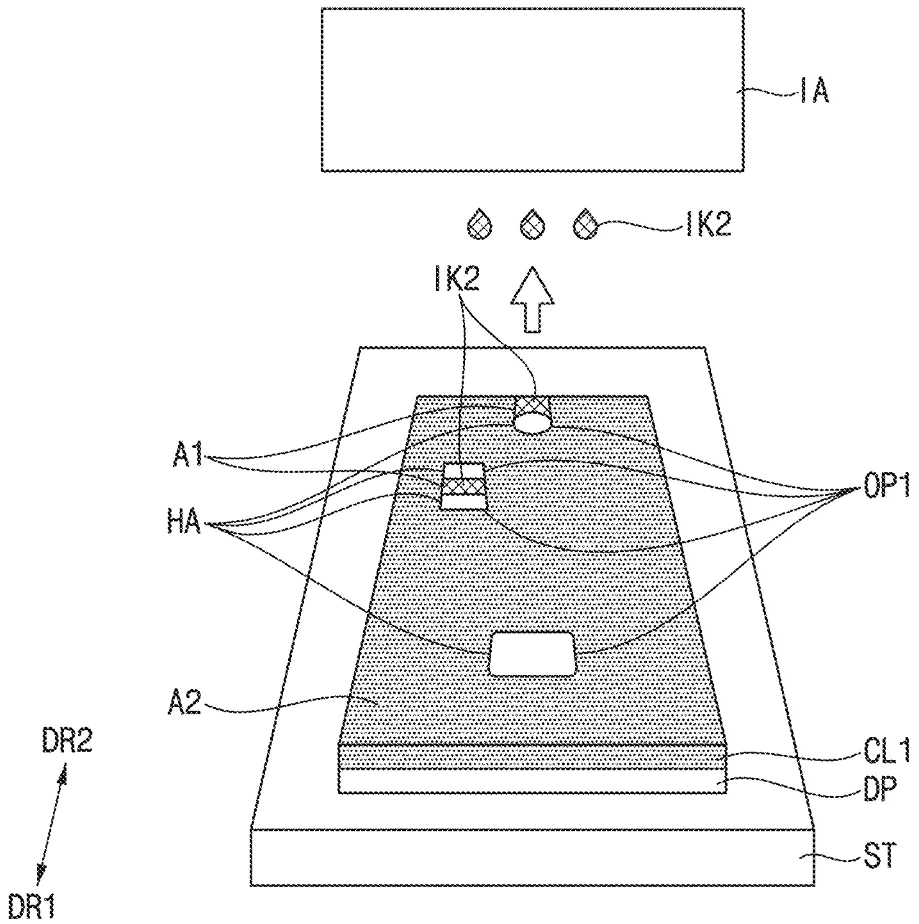
FIGS. 20 to 22 are views illustrating a manufacturing method according to an embodiment of the present disclosure.
Figure 21:
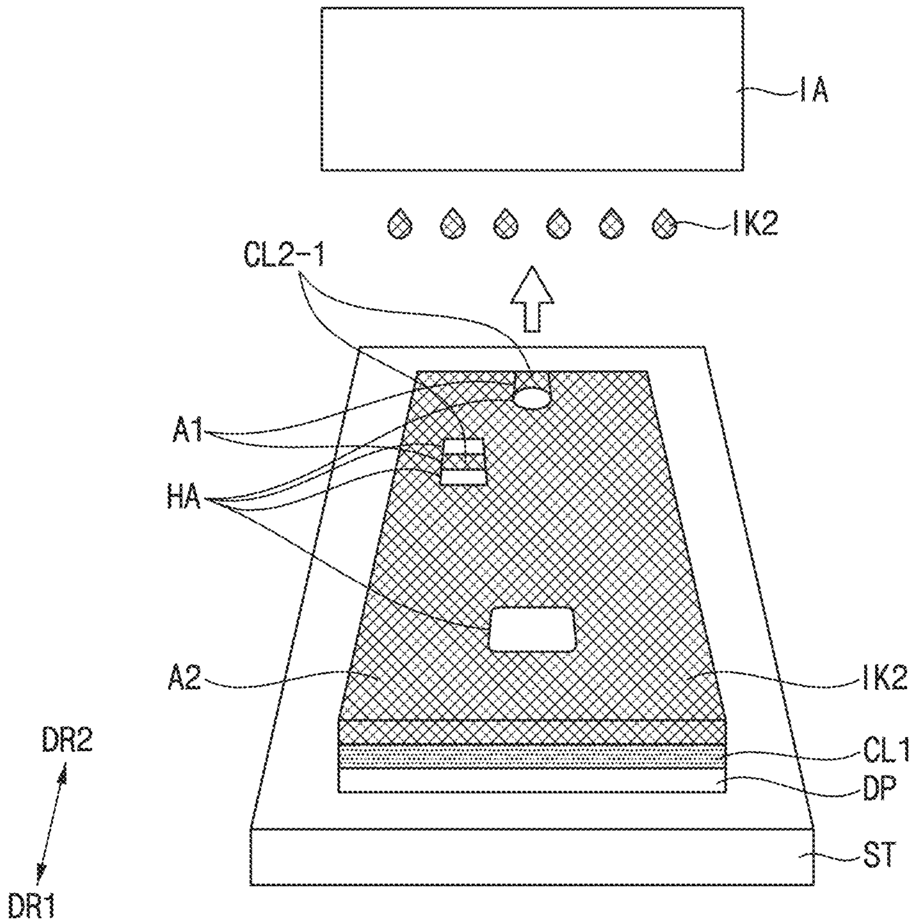
Figure 22:
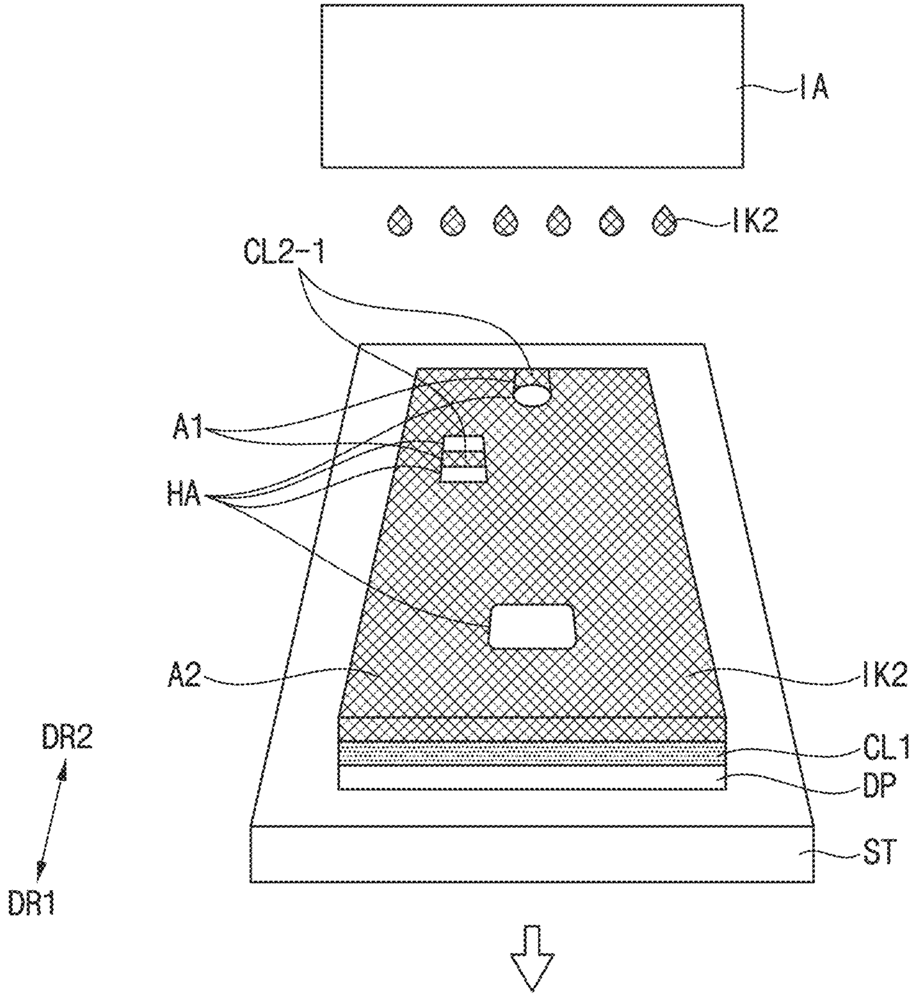

FIGS. 20 to 22 are views illustrating a manufacturing method according to an embodiment of the present disclosure.

Referring to FIG. 20, the inkjet device IA may apply the second ink IK2 to the first area A1 on the first cover layer CL1 in the first direction DR1. In this case, the stage ST on which the display panel DP and the first cover layer CL1 are disposed may move in the second direction DR2.

For example, each of FIGS. 21 and 22 is a view for explaining a coating direction of the second cover layer CL2.

Referring to FIG. 21, in an embodiment, the inkjet device IA may apply the second ink IK2 to the second area A2 on the first cover layer CL1 in the first direction DR1 (same as the first area A1). In this case, the stage ST may move in the second direction DR2. However, the present disclosure is not limited thereto.

Referring to FIG. 22, in another embodiment, the inkjet device IA may apply the second ink IK2 to the second area A2 on the first cover layer CL1 in the second direction DR2 (opposite to the first area A1). In this case, the stage ST may move in the first direction DR1.

However, the present disclosure is not limited thereto. In another embodiment, the inkjet device IA may apply the second ink IK2 to the first area A1 on the first cover layer CL1 in the second direction DR2, and apply the second ink IK2 to the second area A1 on the first cover layer CL1 in the first direction DR1 opposite to the first area A1, or in the second direction DR2 equal to the first area A1.

FIGS. 23 to 30 are views illustrating an apparatus for manufacturing a display device according to an embodiment.

For example, an apparatus 20 for manufacturing a display device described with reference to FIGS. 23 to 30 may be an apparatus for performing the method for manufacturing the display device described with reference to FIGS. 6 to 13. Therefore, redundant descriptions may be omitted.

Figure 23:
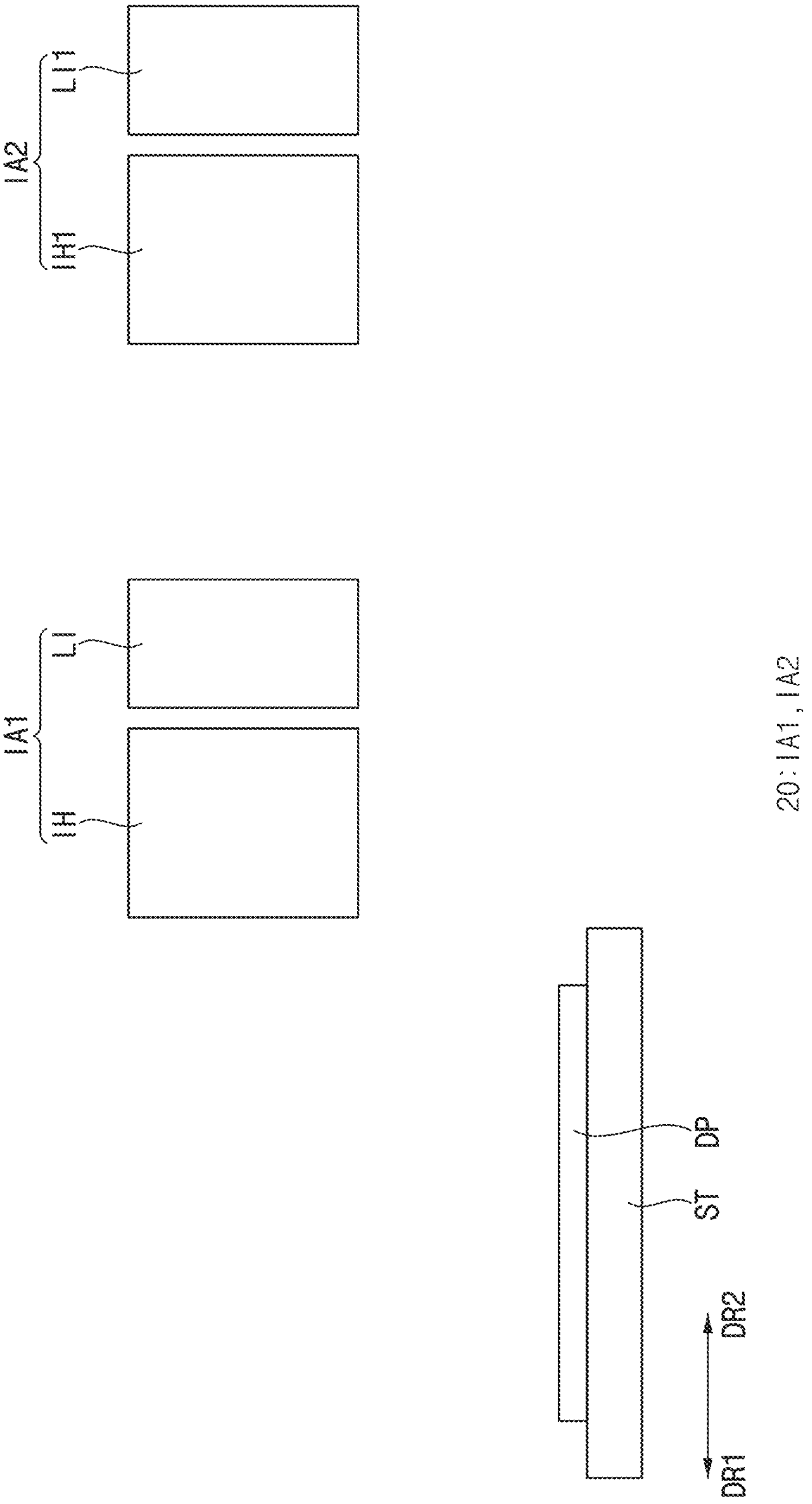
FIGS. 23 to 30 are views illustrating an apparatus for manufacturing a display device according to an embodiment.

Referring to FIG. 23, an apparatus 20 for manufacturing a display device may include a stage ST, a first inkjet device IA1, and a second inkjet device IA2.

A display panel DP may be disposed on the stage ST. The display panel DP may include a hole area, a first area, and a second area.

The stage ST may move the display panel DP in the first direction DR1 or the second direction DR2.

Figure 24:
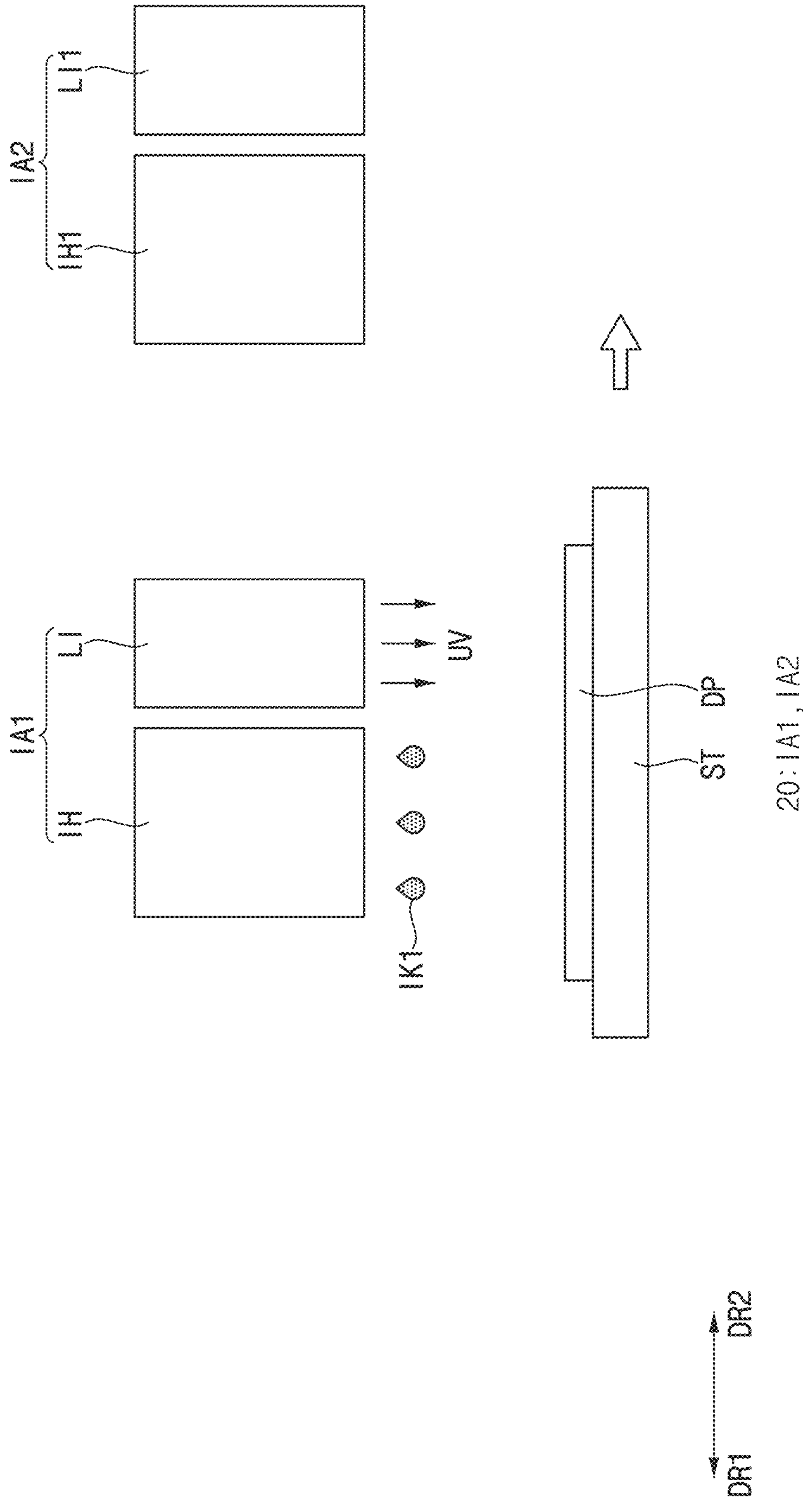
Figure 25:
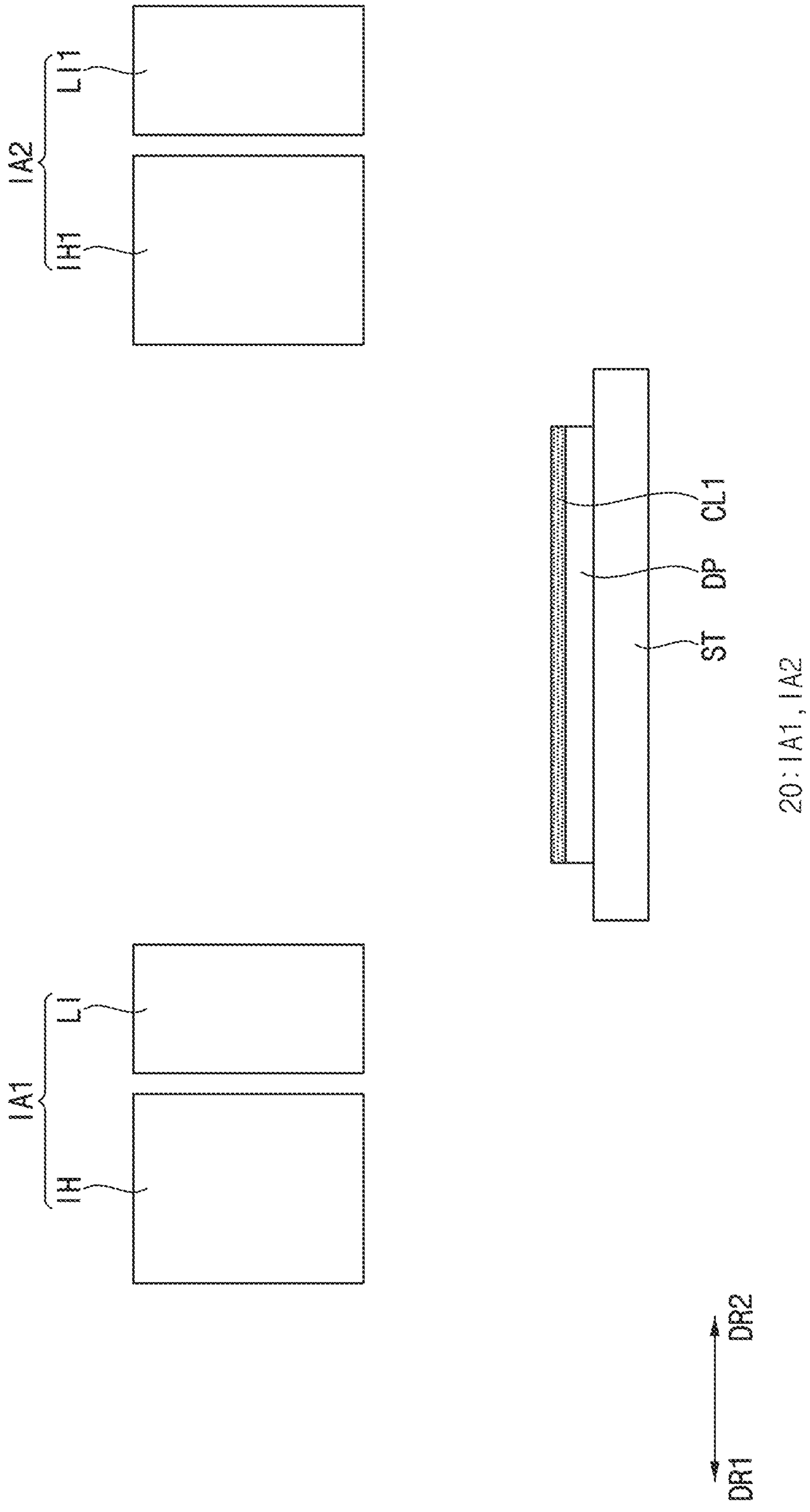

Further referring to FIGS. 24 and 25, the first inkjet device IA1 may be positioned on the stage ST. The first inkjet device IA1 may apply and cure the first ink IK1.

The first inkjet device IA1 may include an inkjet head IH and a light irradiation unit LI. The inkjet head IH may apply the first ink IK1, and the light irradiation unit LI may cure the first ink IK1. That is, the first inkjet device IA1 may form a first cover layer CL1 on the display panel DP.

Figure 26:
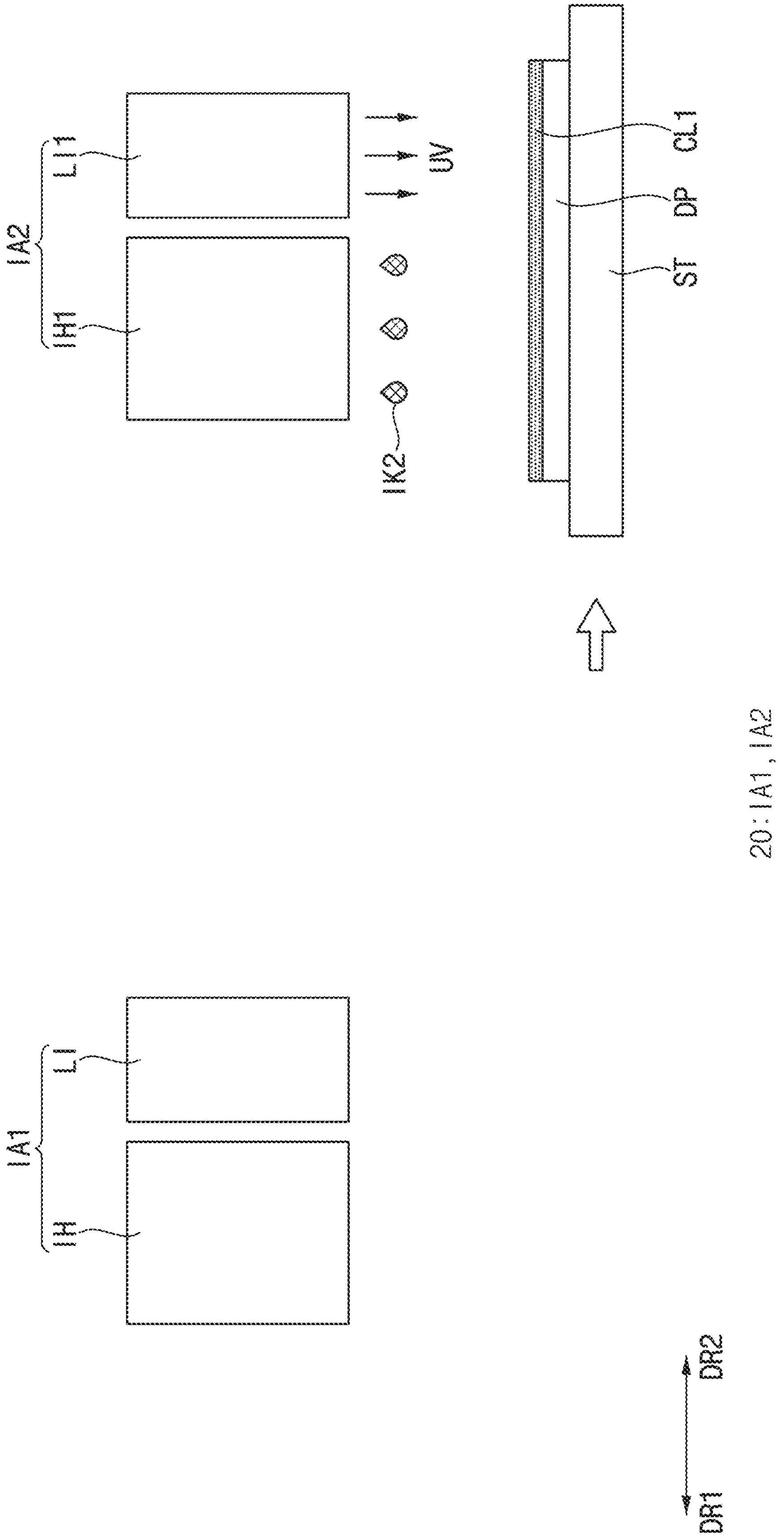
Figure 27:
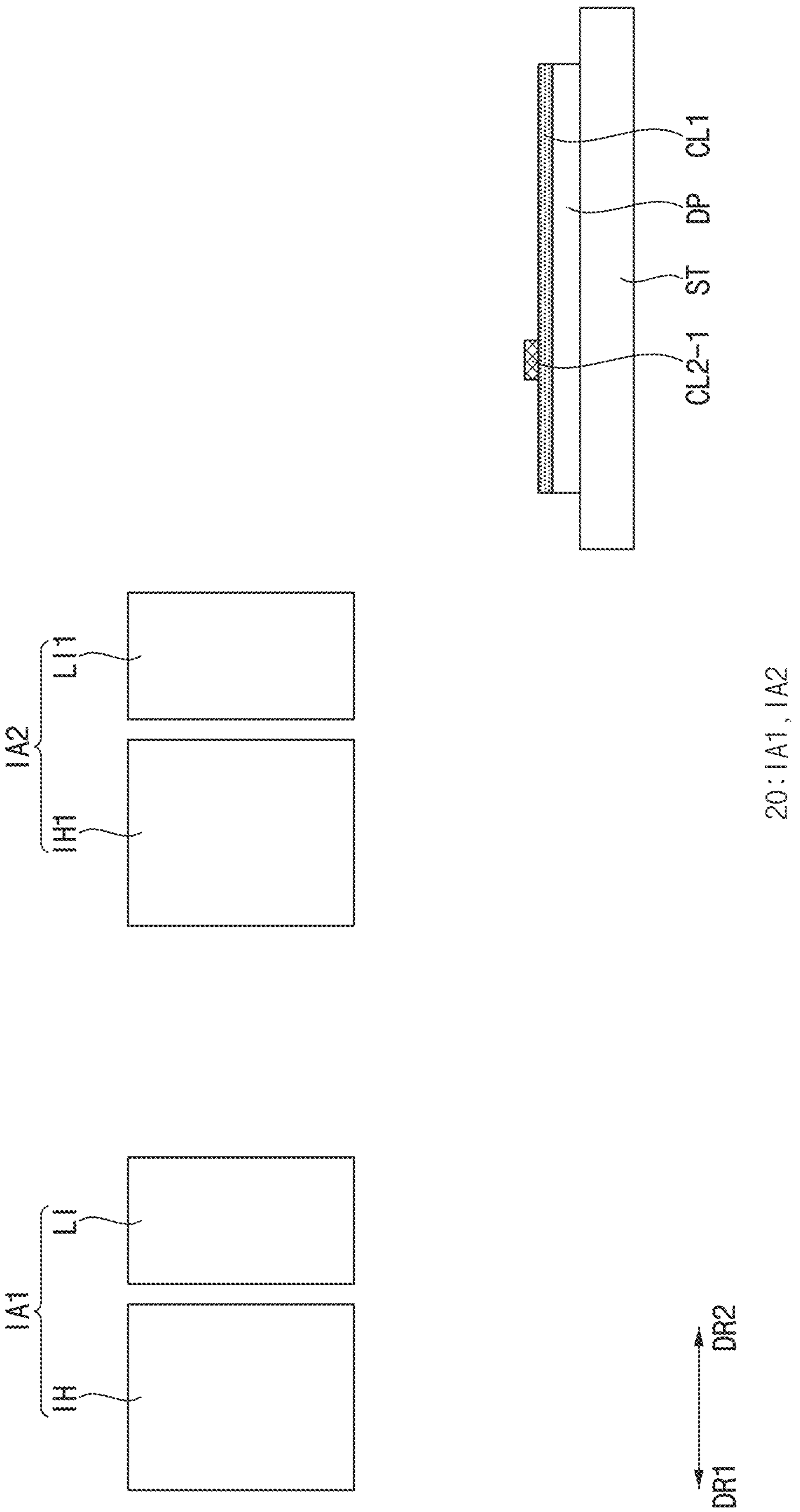

Referring to FIGS. 26 and 27, the second inkjet device IA2 may be positioned on the stage ST and may be spaced apart from the first inkjet device IA1. The second inkjet device IA2 may apply and cure the second ink IK2.

In an embodiment, the second inkjet device IA2 may include at least one inkjet head IH1 and at least one light irradiation unit LI1.

The stage ST may move in the second direction DR2. However, the present disclosure is not limited thereto, and the second inkjet device IA2 may move in the first direction DR1 in another embodiment.

The inkjet head IH1 may apply the second ink IK2 to the first area A1 in the first direction DR1. The light irradiation unit LI1 may cure the second ink IK2. Thus, the first portion CL2-1 of the second cover layer overlapping the first area A1 may be formed.

Figure 28:
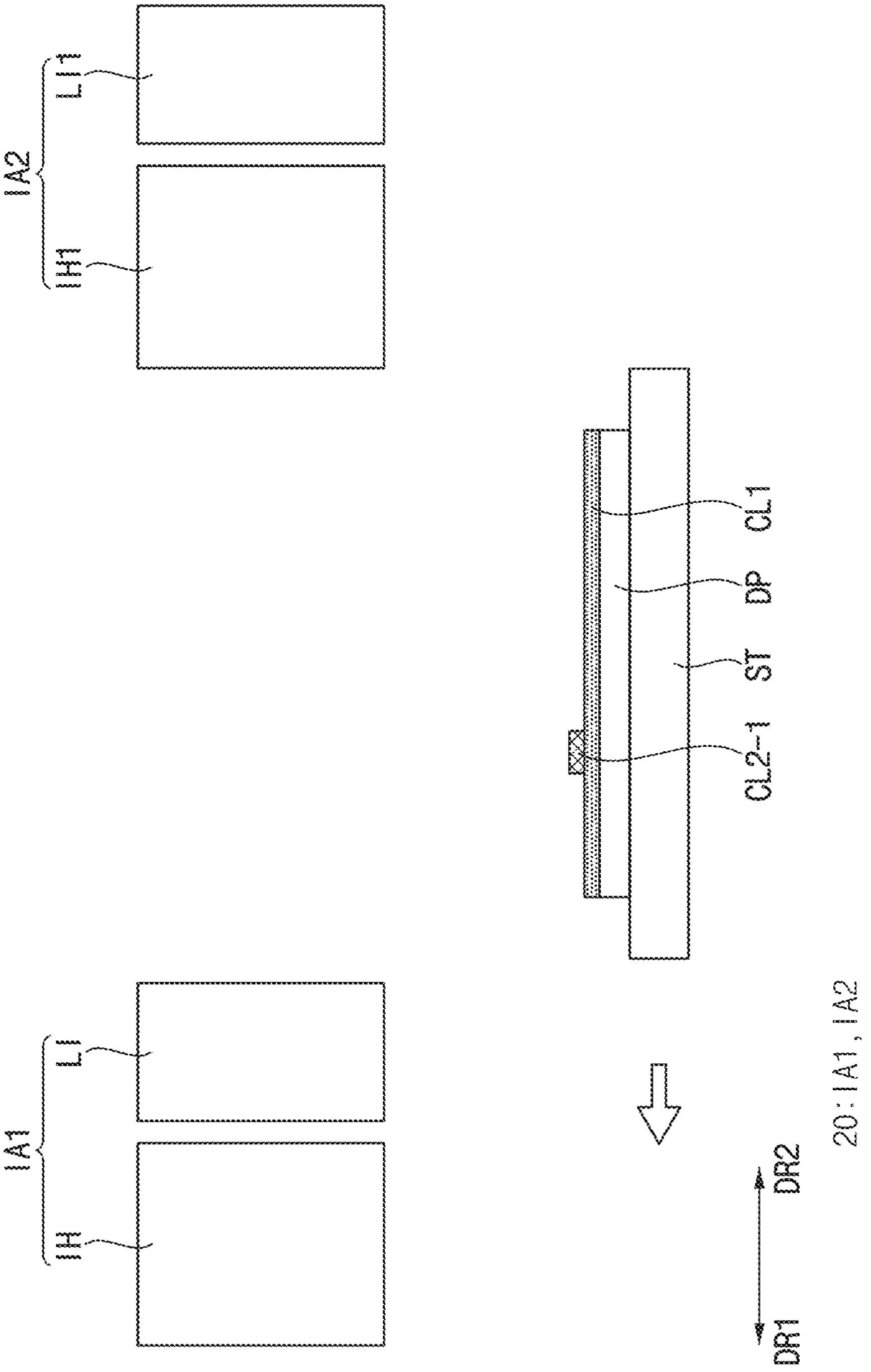

Referring to FIG. 28, the stage ST may move again in the first direction DR1 and return to a position before the first portion CL2-1 of the second cover layer is formed.

Figure 29:
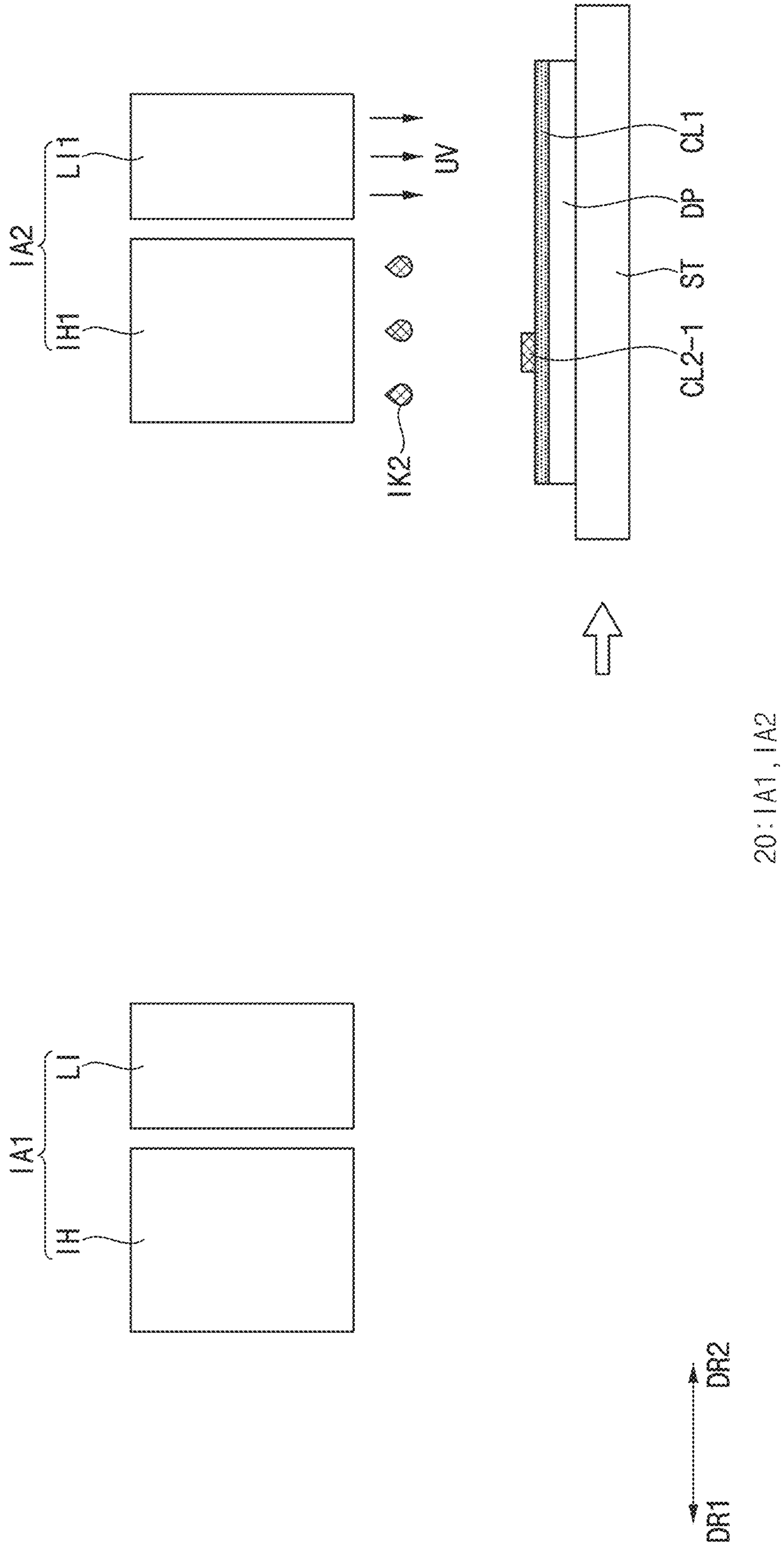
Figure 30:
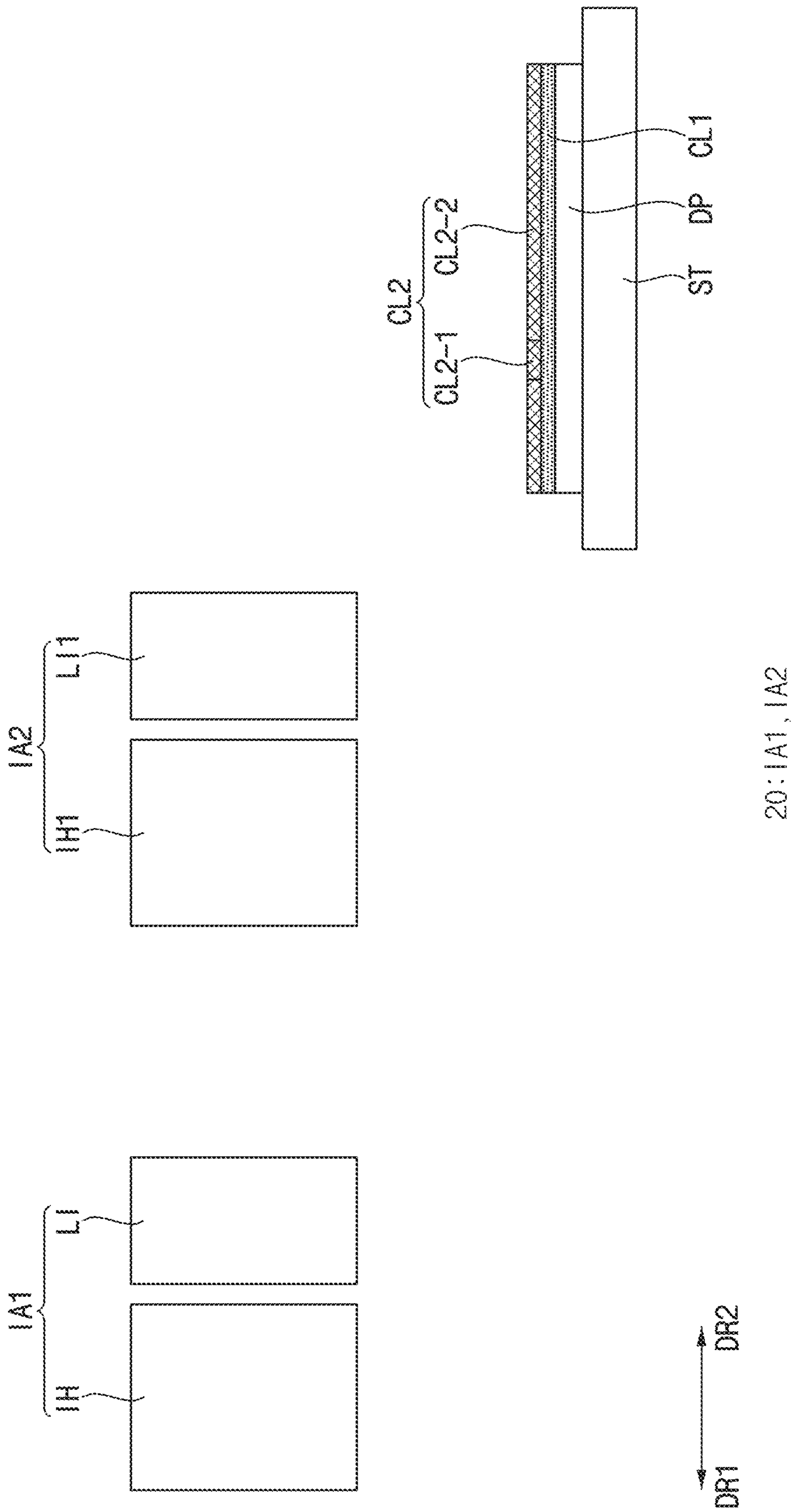

Referring to FIGS. 29 and 30, the stage ST may move in the second direction DR2 again. In this case, the inkjet head IH1 may apply the second ink IK2 to the second area A2 in the first direction DR1. The light irradiation unit LI1 may cure the second ink IK2. Accordingly, a second portion CL2-2 of the second cover layer overlapping the second area A2 may be formed.

As the first portion CL2-1 of the second cover layer and the second portion CL2-2 of the second cover layer are formed, the second cover layer CL2 overlapping the first area A1 and the second area A2 may be formed on the first cover layer CL1.

However, the present disclosure is not limited thereto, and the second inkjet device IA2 may first apply the second ink IK2 to the second area A2 and then cure the second ink IK2 to form the second portion of the second cover layer CL2-2, and then, apply the second ink IK2 to the first area A1 and cure the second ink IK2 to form the first portion CL2-1 of the second cover layer CL2 in another embodiment.

FIGS. 31 to 35 are views illustrating an apparatus for manufacturing a display device according to another embodiment.

For example, an apparatus 21 for manufacturing a display device described with reference to FIGS. 31 to 35 may be substantially equal to the apparatus 20 for manufacturing the display device described with reference to FIGS. 23 to 30 except for the second inkjet device IA2. Therefore, redundant descriptions may be omitted.

Figure 31:
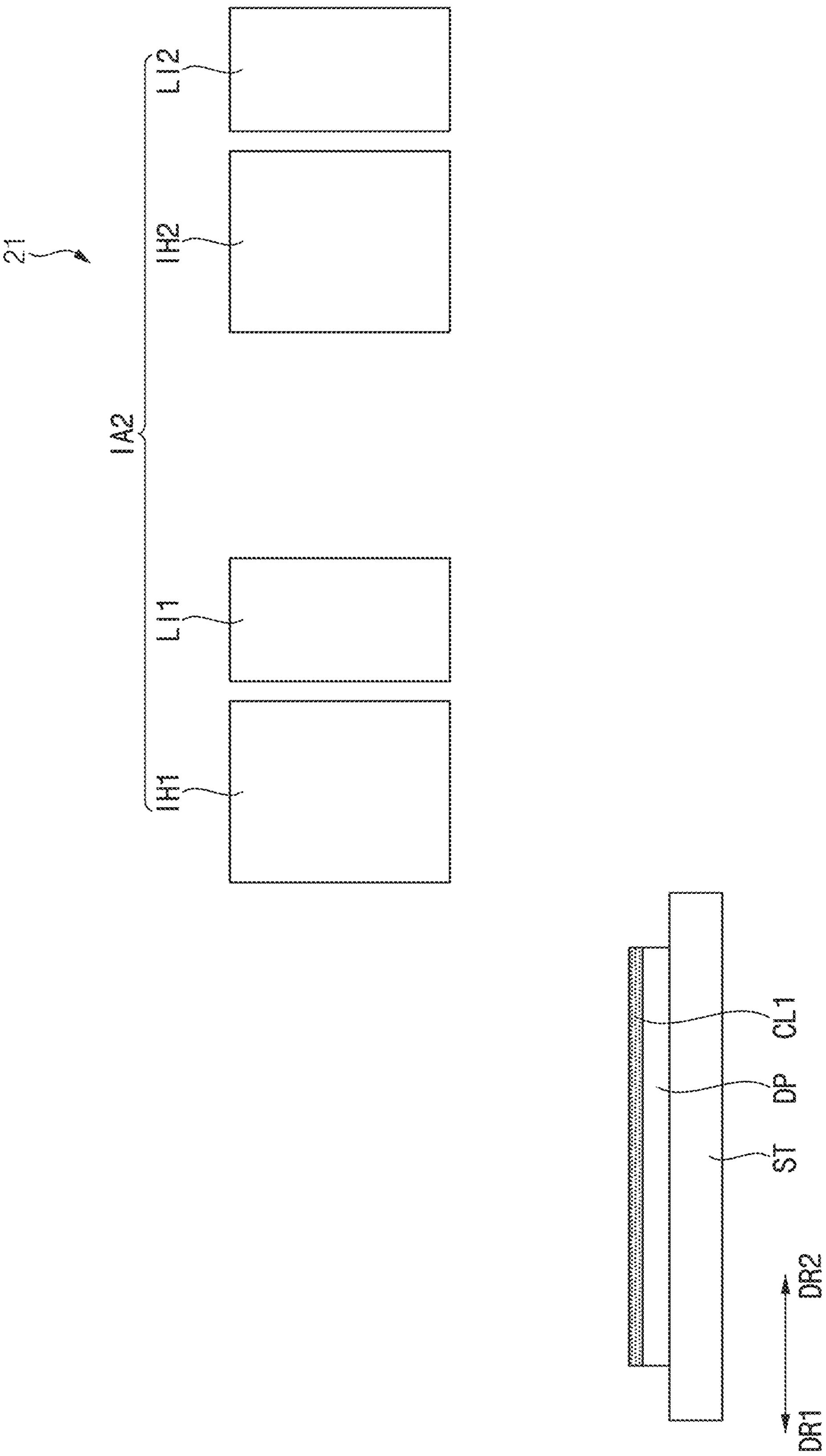
FIGS. 31 to 35 are views illustrating an apparatus for manufacturing a display device according to another embodiment.

Referring to FIG. 31, an apparatus 21 for manufacturing a display device may include a first inkjet device (not shown) and a second inkjet device IA2. The second inkjet device IA2 may include a first inkjet head IH1, a first light irradiation unit LI1, a second inkjet head IH2, and a second light irradiation unit LI2. The first inkjet head IH1, the first light irradiation unit LI1, the second inkjet head IH2, and the second light irradiation unit LI2 may be disposed sequentially in the second direction DR2 on the display panel DP as shown in FIG. 31. The second direction DR2 may be a movement direction of the stage ST.

For example, the first light irradiation unit LI1 may be adjacent to the first inkjet head IH1, and the second inkjet head IH2 may be spaced apart from the first inkjet head IH1. The second light irradiation unit LI2 may be adjacent to the second inkjet head IH2.

Figure 32:
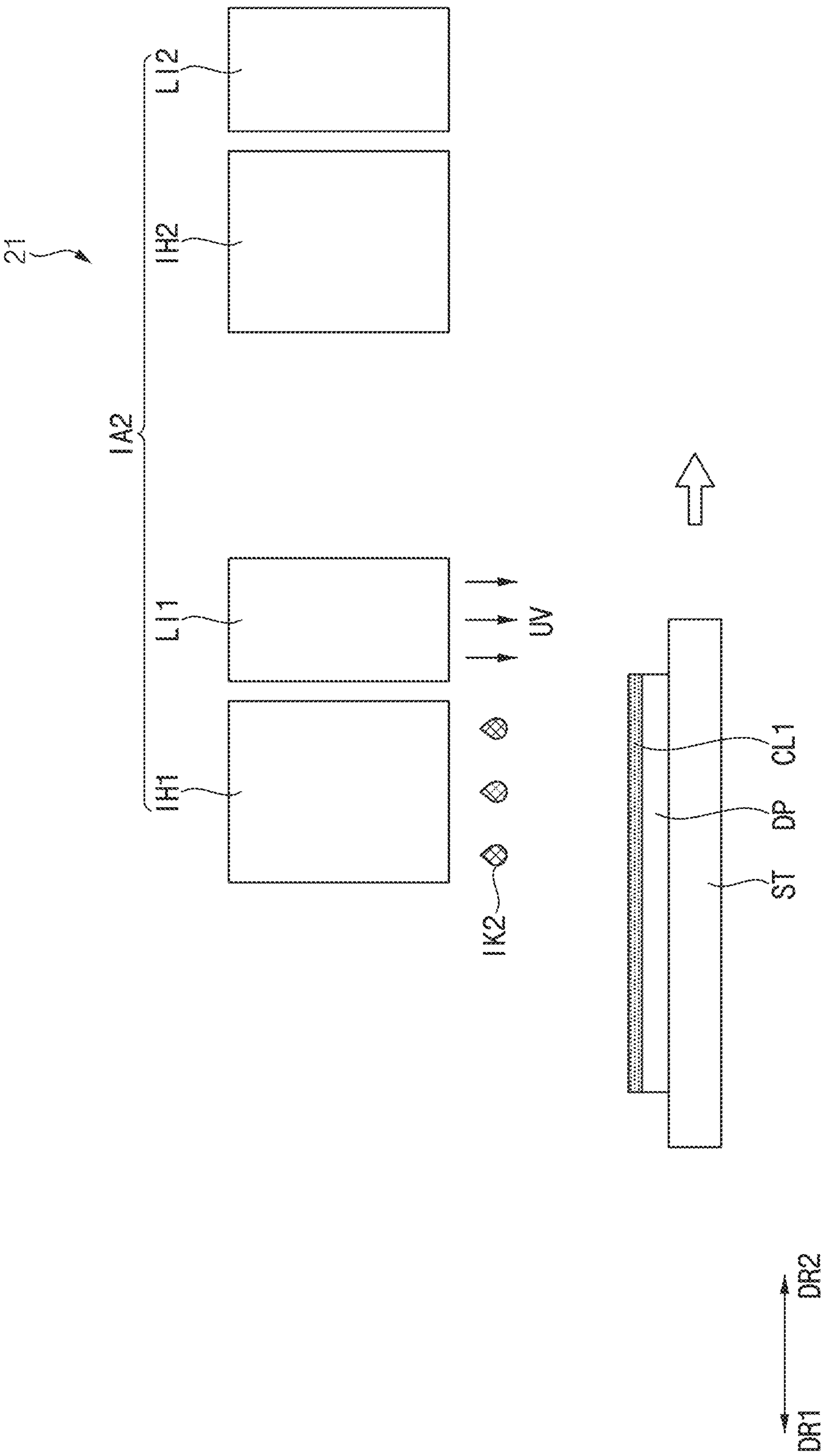
Figure 33:
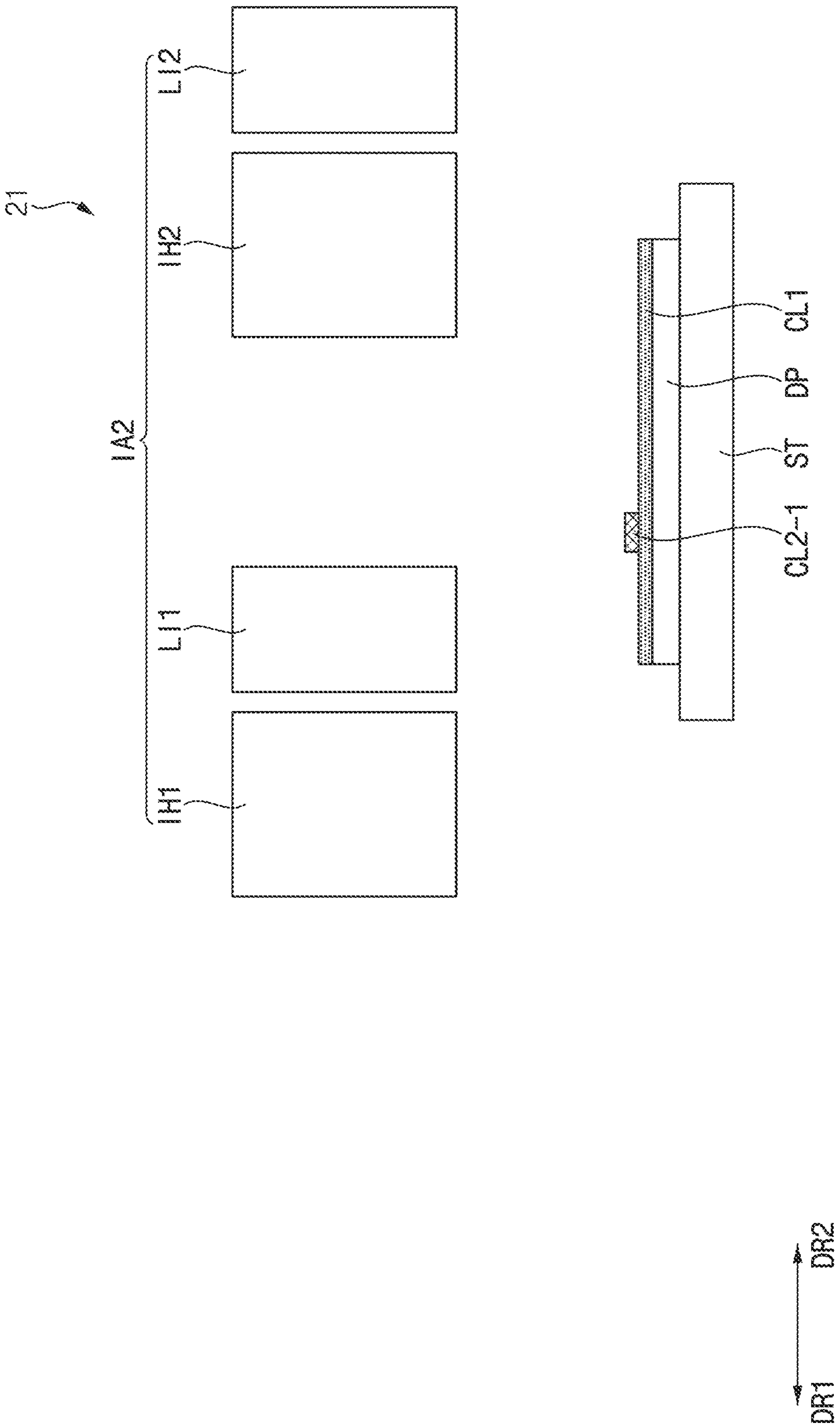

Referring to FIGS. 32 and 33, the stage ST may move in the second direction DR2. However, it is not limited thereto, and the second inkjet device IA2 may move in the first direction DR1 in another embodiment.

The first inkjet head IH1 may apply the second ink IK2 to the first area A1 in the first direction DR1. The first light irradiation unit LI1 may cure the second ink IK2. Thus, the first portion CL2-1 of the second cover layer overlapping the first area A1 may be formed.

Figure 34:
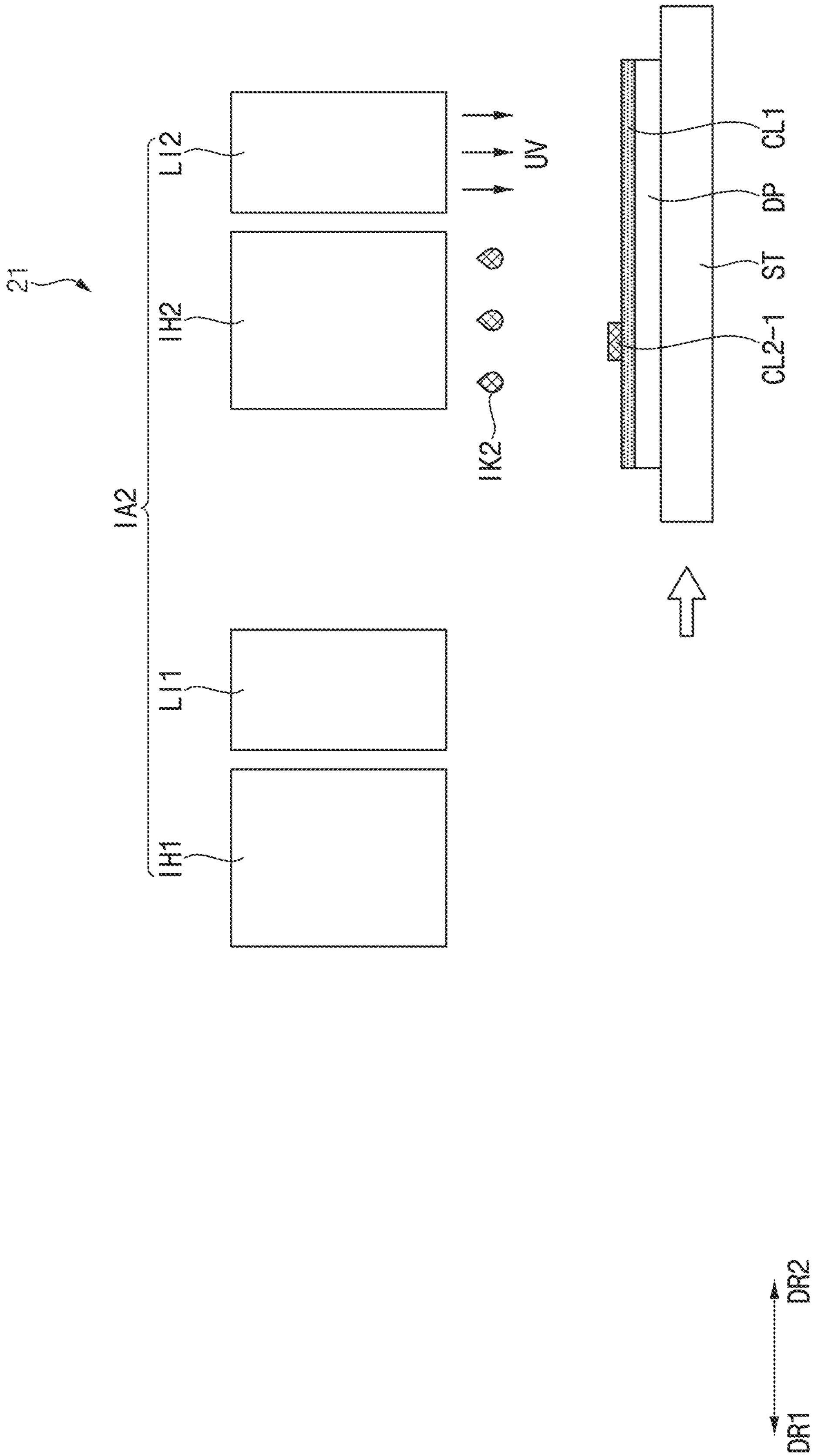
Figure 35:
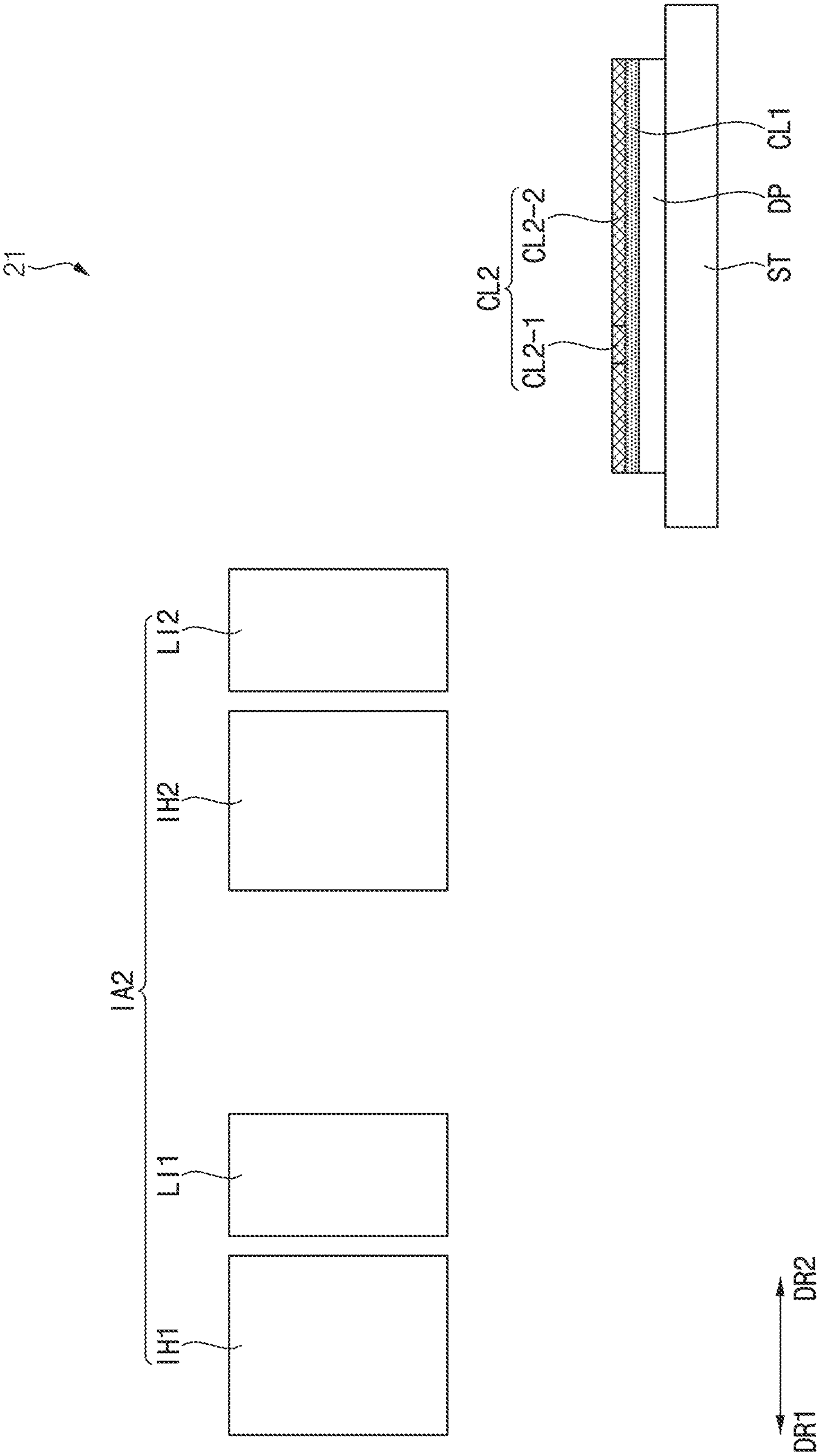

Referring to FIGS. 34 and 35, the stage ST may continuously move in the second direction DR2. In this case, the second inkjet head IH2 may apply the second ink IK2 to the second area A2 in the first direction DR1. The second light irradiation unit LI2 may cure the second ink IK2. Accordingly, a second portion CL2-2 of the second cover layer overlapping the second area A2 may be formed. Thus, the second cover layer CL2 overlapping the first area A1 and the second area A2 may be formed.

However, the present disclosure is not limited thereto, and first the first inkjet head IH1 may apply the second ink IK2 to the second area A2 and then the first light irradiation unit LI1 may cure the second ink IK2 to form the second portion CL2-2 of the second cover layer CL2, and then, the second inkjet head IH2 may apply the second ink IK2 to the first area A1 and the second light irradiation LI2 may cure the second ink IK2 to form the first portion CL2-1 of the second cover layer CL2 in another embodiment.

In an embodiment, as the second inkjet device IA2 includes two inkjet heads IH1 and IH2 and two light irradiators LI1 and LI2, the second cover layer CL2 may be formed by forming the first portion CL2-1 and the second portion CL2-2 in one scan as the stage ST moves in the second direction DR2. Accordingly, the manufacturing time of the second cover layer CL2 may be reduced, and the manufacturing process efficiency of the display device may be improved.

FIGS. 36 to 40 are views illustrating an apparatus for manufacturing a display device according to still another embodiment.

For example, an apparatus 22 for manufacturing a display device described with reference to FIGS. 36 to 40 may be substantially equal to the apparatus 20 for manufacturing the display device described with reference to FIGS. 23 to 30 except for a second inkjet device IA2. Therefore, redundant descriptions may be omitted.

Figure 36:
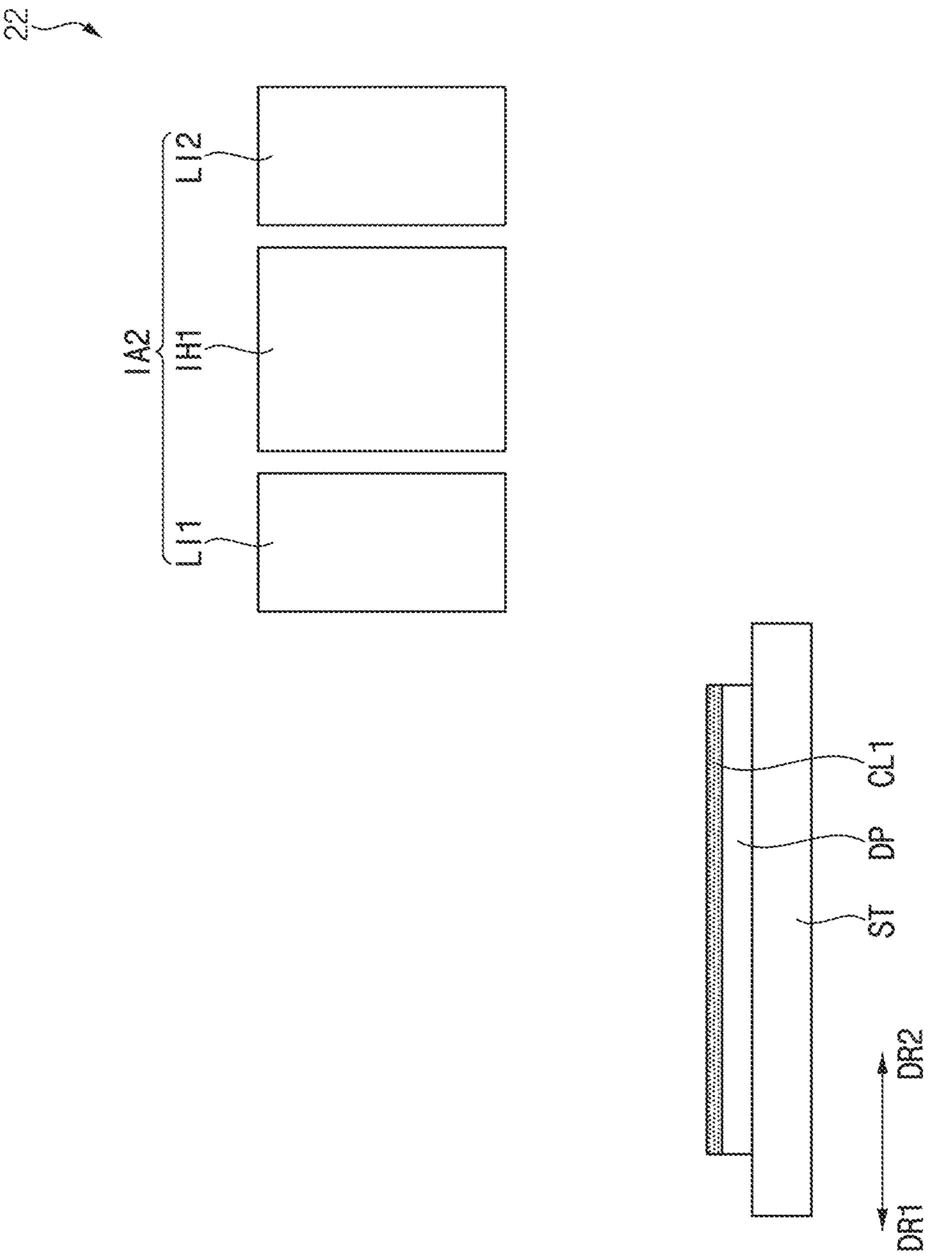
FIGS. 36 to 40 are views illustrating an apparatus for manufacturing a display device according to still another embodiment.

Referring to FIG. 36, an apparatus 22 for manufacturing a display device may include a first inkjet device (not shown) and a second inkjet device IA2. The second inkjet device IA2 may include a first light irradiation unit LI1, a first inkjet head IH1, and a second light irradiation unit LI2. The first light irradiation unit LI1, the first inkjet head IH1, and the second light irradiation unit LI2 may be sequentially positioned in the second direction DR2 on the display panel DP as shown in FIG. 36. The second direction DR2 may be a movement direction of the stage ST.

Figure 37:
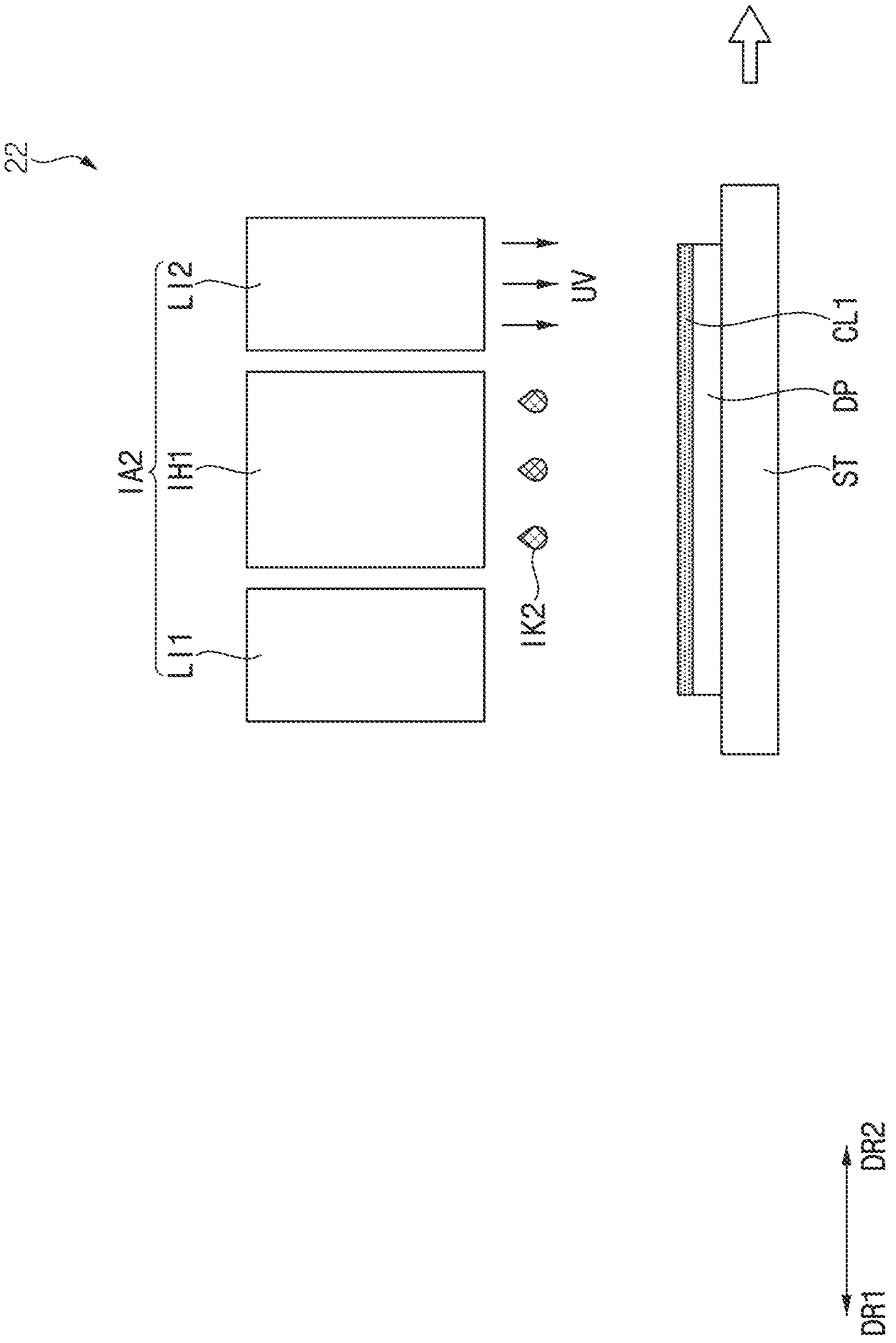
Figure 38:
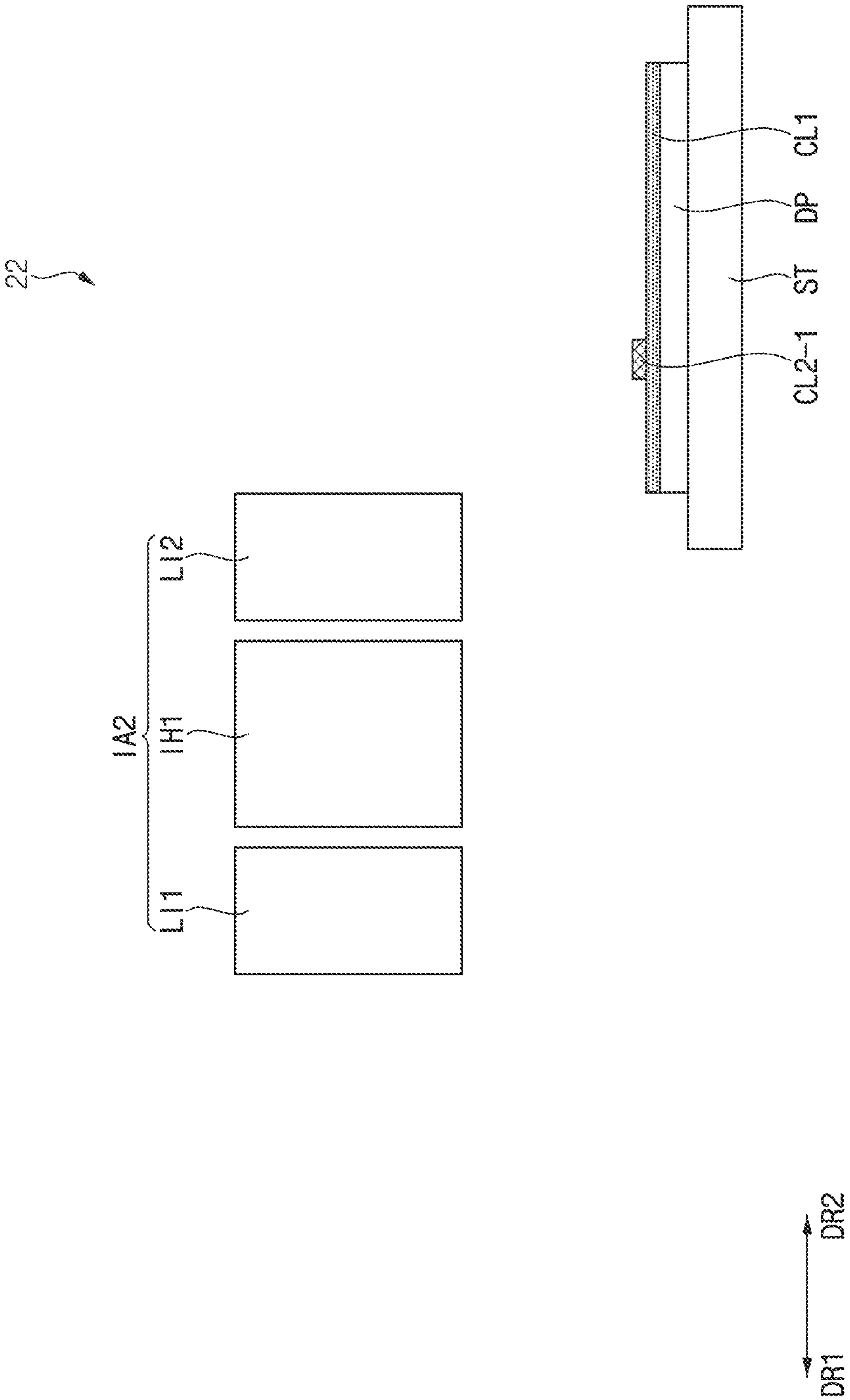

Referring to FIGS. 37 and 38, the stage ST may move in the second direction DR2. However, it is not limited thereto, and the second inkjet device IA2 may move in the first direction DR1 in another embodiment.

The first inkjet head IH1 may apply the second ink IK2 to the first area A1 in the first direction DR1. The second light irradiation unit LI2 may cure the second ink IK2. Thus, the first portion CL2-1 of the second cover layer overlapping the first area A1 may be formed.

Figure 39:
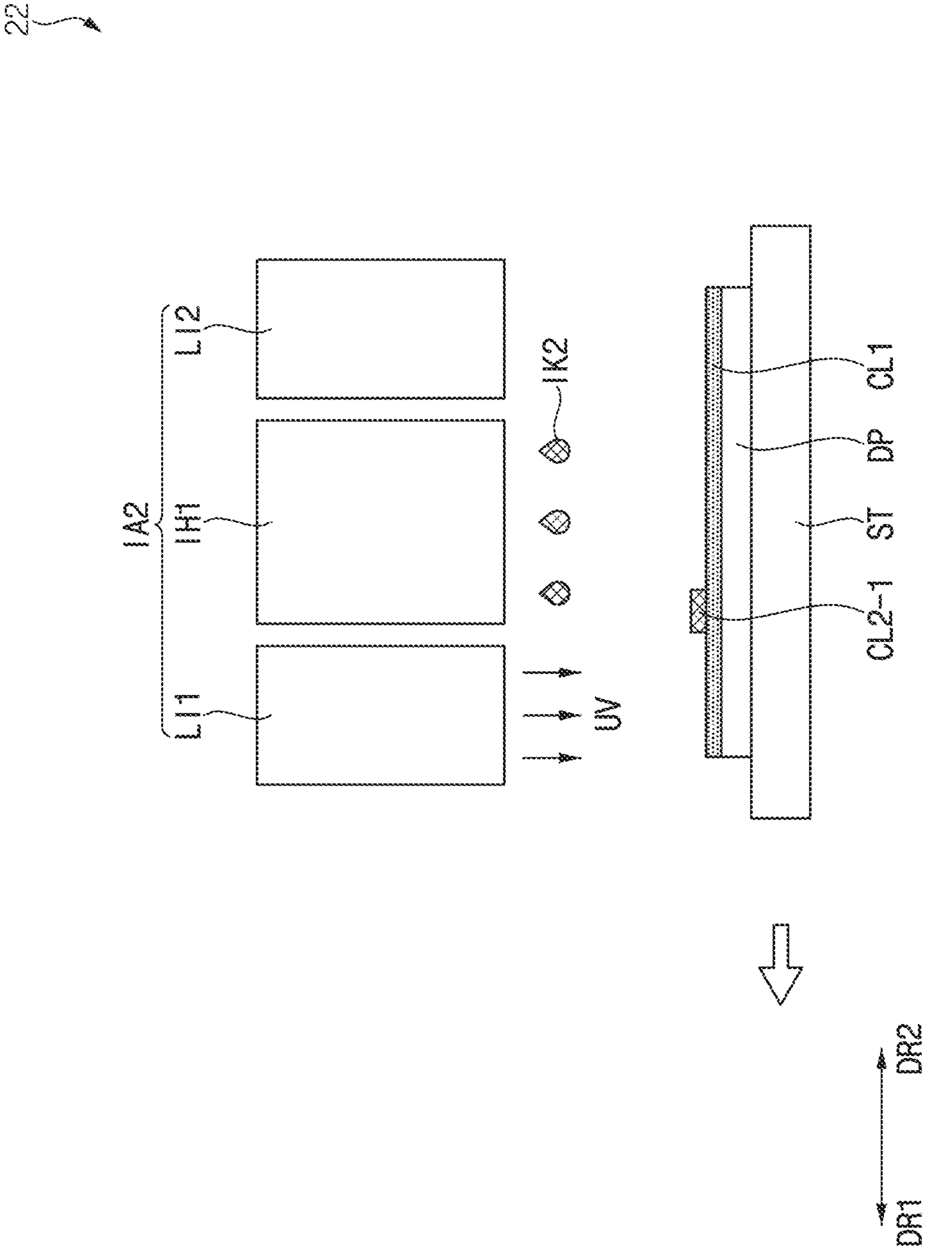
Figure 40:
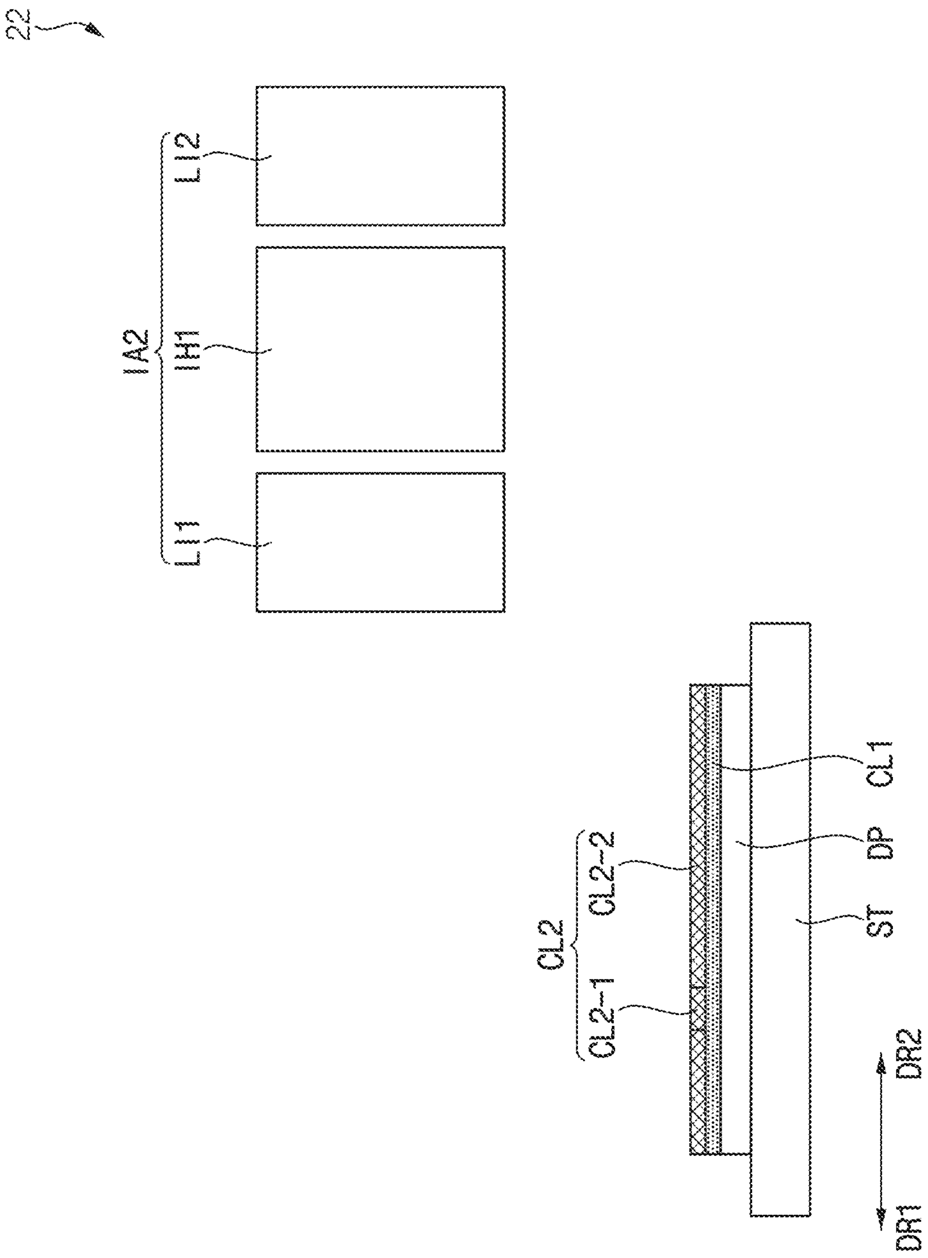

Referring to FIGS. 39 and 40, the stage ST may move in the first direction DR1 which is opposite to the second direction DR2. At this time, the first inkjet head IH1 may apply the second ink IK2 to the second area A2 in the second direction DR2. The first light irradiation unit LI1 may cure the second ink IK2. Accordingly, a second portion CL2-2 of the second cover layer CL2 overlapping the second area A2 may be formed. Thus, the second cover layer CL2 overlapping the first area A1 and the second area A2 may be formed.

However, the present disclosure is not limited thereto, and first the first inkjet head IH1 may apply the second ink IK2 to the second area A2 and then the second light irradiation unit LI2 may cure the second ink IK2 to form the second portion CL2-2 of the second cover layer CL2, and then, the first inkjet head IH1 may apply the second ink IK2 to the first area A1 and the second light irradiation LI2 may cure the second ink IK2 to form the first portion CL2-1 of the second cover layer CL2.

In an embodiment, as the second inkjet device IA2 includes the first light irradiation unit LI1, the first inkjet head IH1, and the second light irradiation unit LI2 adjacent to each other, the stage ST may move in the first direction DR1 to form the first portion CL2-1 or the second portion CL2-2, and the stage ST may move in the second direction DR2 to form the remaining portion of the second cover layer CL2. Accordingly, the manufacturing time of the second cover layer CL2 may be reduced, and the manufacturing process efficiency of the display device may be improved by reducing manufacturing cost of the display device.

The display device, the method, and the apparatus according to the embodiments may be applied to a display device included in a computer, a notebook, a mobile phone, a smartphone, a smart pad, a PMP, a PDA, an MP3 player, or the like.

Although the display device, the method, and the apparatus according to the embodiments have been described with reference to the drawings, the illustrated embodiments are examples, and may be modified and changed by a person having ordinary knowledge in the relevant technical field without departing from the technical spirit described in the following claims.

What is claimed is:

1. A method of manufacturing a display device, the method comprising:
   - positioning a display panel including a hole area, a first area adjacent to the hole area, and a second area other than the hole area and the first area on a stage;
   - forming a first cover layer defining a first opening therein overlapping the hole area by applying and curing a first ink to the first area and the second area on the display panel;
   - applying and curing a second ink to the first area on the first cover layer; and
   - applying and curing the second ink to the second area on the first cover layer,
   - wherein the applying and the curing of the second ink to the first area are performed before or after the applying and the curing of the second ink to the second area.

2. The method of claim 1, wherein the applying and curing of the second ink to the first area and the applying and curing of the second ink to the second area are performed separately.

3. The method of claim 1, wherein the first area is adjacent to the hole area in a first direction, and a width of the first area in the first direction is about 4 mm or less and greater than 0.

4. The method of claim 3, wherein in the applying of the second ink to the first area, the second ink is applied in the first direction.

5. The method of claim 4, wherein in the applying of the second ink to the second area, the second ink is applied in the first direction.

6. The method of claim 4, wherein in the applying of the second ink to the second area, the second ink is applied in a second direction opposite to the first direction.

7. The method of claim 1, wherein a second cover layer defining a second opening therein overlapping the hole area is formed by applying and curing the second ink to the first area and applying and curing the second ink to the second area.

8. The method of claim 7, wherein a shape matching ratio of the second cover layer overlapping the first area is about 60% or more.

9. The method of claim 8, wherein the shape matching ratio is calculated according to Equation 1 below:

$$\left(1 - \frac{EA + UA}{PA}\right) * 100\ (\%), \qquad \text{[Equation 1]}$$

wherein PA is an area of a target shape of the second cover layer overlapping the first area in a cross-sectional view, EA is an area of a portion of the second cover layer overlapping the first area outside the target shape, and UA is an area of a portion of the target shape outside the second cover layer.

10. The method of claim 1, wherein the second ink is applied and cured in the second area after the second ink is applied and cured in the first area.

11. The method of claim 1, wherein the second ink is applied and cured in the first area after the second ink is applied and cured in the second area.

12. The method of claim 1, wherein the second ink includes an acrylic resin.

* * * * *